United States Patent
Chang et al.

(10) Patent No.: US 12,361,192 B2
(45) Date of Patent: *Jul. 15, 2025

(54) MEMORY DEVICE, INTEGRATED CIRCUIT DEVICE AND METHOD

(71) Applicant: TAIWAN SEMICONDUCTOR MANUFACTURING COMPANY, LTD., Hsinchu (TW)

(72) Inventors: Meng-Sheng Chang, Hsinchu (TW); Chia-En Huang, Hsinchu (TW); Chien-Ying Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 23 days.

This patent is subject to a terminal disclaimer.

(21) Appl. No.: 18/053,030

(22) Filed: Nov. 7, 2022

(65) Prior Publication Data

US 2023/0089590 A1 Mar. 23, 2023

Related U.S. Application Data

(63) Continuation of application No. 17/103,159, filed on Nov. 24, 2020, now Pat. No. 11,501,051.

(Continued)

(51) Int. Cl.
  *G06F 30/392* (2020.01)
  *G03F 1/70* (2012.01)
  *G06F 30/398* (2020.01)

(52) U.S. Cl.
  CPC ............. *G06F 30/392* (2020.01); *G03F 1/70* (2013.01); *G06F 30/398* (2020.01)

(58) Field of Classification Search
  CPC ...... G06F 17/16; G06F 13/1673; G06F 13/20; G06F 13/4068; G06F 21/44; G06F 21/73;
  (Continued)

(56) References Cited

U.S. PATENT DOCUMENTS

| 6,590,797 B1 | 7/2003 | Nachumovsky et al. |
| 7,260,442 B2 | 8/2007 | Hwang et al. |

(Continued)

FOREIGN PATENT DOCUMENTS

| CN | 111079315 | 4/2020 |
| KR | 20100055823 | 5/2010 |

(Continued)

OTHER PUBLICATIONS

Office Action dated Jun. 23, 2021 from corresponding case No. DE 10 2020 132 547.9 (pp. 1-9).

*Primary Examiner* — Binh C Tat
(74) *Attorney, Agent, or Firm* — Hauptman Ham, LLP

(57) ABSTRACT

A memory device includes a bit line, a word line, a memory cell including a capacitor and a transistor, and a controller. The transistor has a gate terminal coupled to the word line, a first terminal, and a second terminal. The capacitor has a first end coupled to the first terminal of the transistor, a second end coupled to the bit line, and an insulating material between the first end and the second end. The controller, in a programming operation, applies a turn-ON voltage via the word line to the gate terminal of the transistor to turn ON the transistor, and applies a program voltage via the bit line to the second end of the capacitor to apply, while the transistor is turned ON, a predetermined break-down voltage or higher between the first end and the second end of the capacitor to break down the insulating material of the capacitor.

20 Claims, 21 Drawing Sheets

Related U.S. Application Data

(60) Provisional application No. 63/034,673, filed on Jun. 4, 2020.

(58) Field of Classification Search
CPC ...... G06F 3/0605; G06F 3/0659; G06F 30/34; G06F 30/392; G06F 30/398; G06F 2119/02; H01L 29/40117; H01L 29/0847; H01L 2224/48227; H01L 2224/73265; H01L 2225/1023; H01L 2224/05572; H01L 2924/00; H01L 2924/15311; H01L 2224/12105; H01L 2224/04105; H01L 24/45; H01L 24/48; H01L 2224/05025; H01L 2224/73267; G03F 1/70
USPC .................................................. 716/118–125
See application file for complete search history.

(56) References Cited

U.S. PATENT DOCUMENTS

| | | |
|---|---|---|
| 9,256,709 B2 | 2/2016 | Yu et al. |
| 11,568,123 B2 * | 1/2023 | Fan ....................... G06F 30/398 |
| 2008/0237591 A1 | 10/2008 | Leedy |
| 2010/0078700 A1 | 4/2010 | Saito |
| 2013/0055111 A1 | 2/2013 | Son et al. |
| 2013/0294141 A1 | 11/2013 | Oh et al. |
| 2014/0040838 A1 | 2/2014 | Liu et al. |
| 2015/0162063 A1 * | 6/2015 | Mueller ................ G11C 11/221 365/145 |
| 2015/0278429 A1 | 10/2015 | Chang |
| 2016/0141337 A1 | 5/2016 | Shimabukuro et al. |
| 2017/0047126 A1 | 2/2017 | Chung |
| 2019/0319044 A1 * | 10/2019 | Harari ................. H01L 23/5226 |
| 2020/0227478 A1 | 7/2020 | Han et al. |

FOREIGN PATENT DOCUMENTS

| | | |
|---|---|---|
| KR | 20130021760 | 3/2013 |
| TW | 201830262 | 8/2018 |

* cited by examiner

ND METHOD

RELATED APPLICATION(S)

The instant application is a continuation application of application Ser. No. 17/103,159, filed Nov. 24, 2020, now U.S. Pat. No. 11,501,051, issued Nov. 15, 2022, which claims the benefit of U.S. Provisional Application No. 63/034,673, filed Jun. 4, 2020. The entireties of the above-noted applications and patent(s) are incorporated by reference herein.

BACKGROUND

An integrated circuit (IC) device includes a number of semiconductor devices represented in an IC layout diagram. An IC layout diagram is hierarchical and includes modules which carry out higher-level functions in accordance with the semiconductor device design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs. Examples of semiconductor devices and cells correspondingly include memory devices and memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
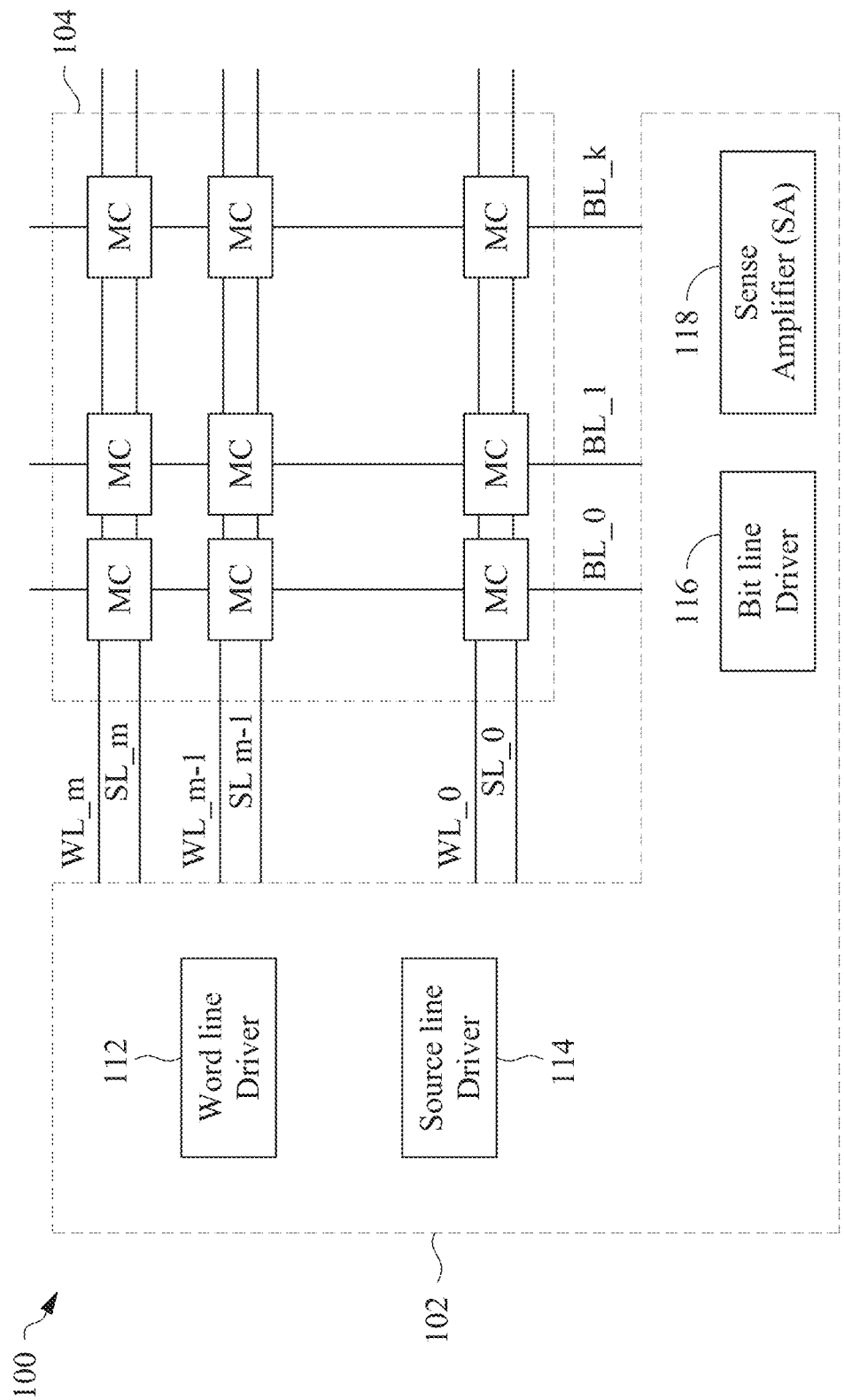
FIG. 1 is a schematic block diagram of a memory device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Source/drain(s) may refer to a source or a drain, individually or collectively dependent upon the context.

In some embodiments, a memory cell has a one-transistor-one-capacitor (1T1C) configuration having a capacitor and a transistor coupled in series between a bit line and ground. A gate terminal of the transistor is coupled to a word line. The capacitor is a metal-inter (or insulator)-metal (MIM) capacitor over the transistor. An insulating material of the capacitor is configured to break down under a predetermined breakdown voltage or higher applied across the insulating material. When the insulating material is not yet broken down, the memory cell stores a first datum, e.g., logic "1." When the insulating material is broken down, the memory cell stores a second datum, e.g., logic "0." Compared to other approaches such as gate oxide anti-fuses and metal fuses, the memory cell in at least one embodiment provides one or more improvements including, but not limited to, smaller chip area, lower program voltage, lower disturb voltage or the like.

FIG. 1 is a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100 comprises at least one memory cell MC and a controller (also referred to as "control circuit") 102 coupled to control an operation of the memory cell MC. In the example configuration in FIG. 1, the memory device 100 comprises a plurality of memory cells MC arranged in a plurality of columns and rows in a memory array 104. The memory device 100 further comprises a plurality of word lines WL_0 to WL_m extending along the rows, a plurality of source lines SL_0 to SL_m extending along the rows, and a plurality of bit lines (also referred to as "data lines") BL_0 to BL_k extending along the columns of the memory cells MC. Each of the memory cells MC is coupled to the controller 102 by at least one of the word lines, at least one of the source lines, and at least one of the bit lines. Examples of word lines include, but are not limited to, read word lines for transmitting addresses of the memory cells MC to be read from, write word lines for transmitting addresses of the memory cells MC to be written to, or the like. In at least one embodiment, a set of word lines is configured to perform as both read word lines and write word lines. Examples of bit lines include read bit lines for transmitting data read from the memory cells MC indicated by corresponding word lines, write bit lines for transmitting data to be written to the memory cells MC indicated by corresponding word lines, or the like. In at least one embodiment, a set of bit lines is configured to perform as both read bit lines and write bit lines. In one or more embodiments, each memory cell MC is coupled to a pair of bit lines referred to as a bit line and a bit line bar. The word lines are commonly referred to herein as WL, the source lines are commonly referred to herein as SL, and the bit lines are commonly referred to herein as BL. Various numbers of word lines and/or bit lines and/or source lines in the memory device 100 are within the scope of various embodiments. In at least one embodiment, the source lines SL are arranged in the columns, rather than in the rows as shown in FIG. 1. In at least one embodiment, the source lines SL are omitted.

In the example configuration in FIG. 1, the controller 102 comprises a word line driver 112, a source line driver 114, a bit line driver 116, and a sense amplifier (SA) 118 which are configured to perform at least one of a read operation or a write operation. In at least one embodiment, the controller 102 further includes one or more clock generators for providing clock signals for various components of the memory device 100, one or more input/output (I/O) circuits for data exchange with external devices, and/or one or more controllers for controlling various operations in the memory device 100. In at least one embodiment, the source line driver 114 is omitted.

The word line driver 112 is coupled to the memory array 104 via the word lines WL. The word line driver 112 is configured to decode a row address of the memory cell MC selected to be accessed in a read operation or a write operation. The word line driver 112 is configured to supply a voltage to the selected word line WL corresponding to the decoded row address, and a different voltage to the other, unselected word lines WL. The source line driver 114 is coupled to the memory array 104 via the source lines SL. The source line driver 114 is configured to supply a voltage to the selected source line SL corresponding to the selected memory cell MC, and a different voltage to the other, unselected source lines SL. The bit line driver 116 (also referred as "write driver") is coupled to the memory array 104 via the bit lines BL. The bit line driver 116 is configured to decode a column address of the memory cell MC selected to be accessed in a read operation or a write operation. The bit line driver 116 is configured to supply a voltage to the selected bit line BL corresponding to the decoded column address, and a different voltage to the other, unselected bit lines BL. In a write operation, the bit line driver 116 is configured to supply a write voltage (also referred to as "program voltage") to the selected bit line BL. In a read operation, the bit line driver 116 is configured to supply a read voltage to the selected bit line BL. The SA 118 is coupled to the memory array 104 via the bit lines BL. In a read operation, the SA 118 is configured to sense data read from the accessed memory cell MC and retrieved through the corresponding bit lines BL. The described memory device configuration is an example, and other memory device configurations are within the scopes of various embodiments. In at least one embodiment, the memory device 100 is a one-time programmable (OTP) non-volatile memory, and the memory cells MC are OTP memory cells. Other types of memory are within the scopes of various embodiments. Example memory types of the memory device 100 include, but are not limited to, electrical fuse (eFuse), anti-fuse, magnetoresistive random-access memory (MRAM), or the like.

Figure 2:
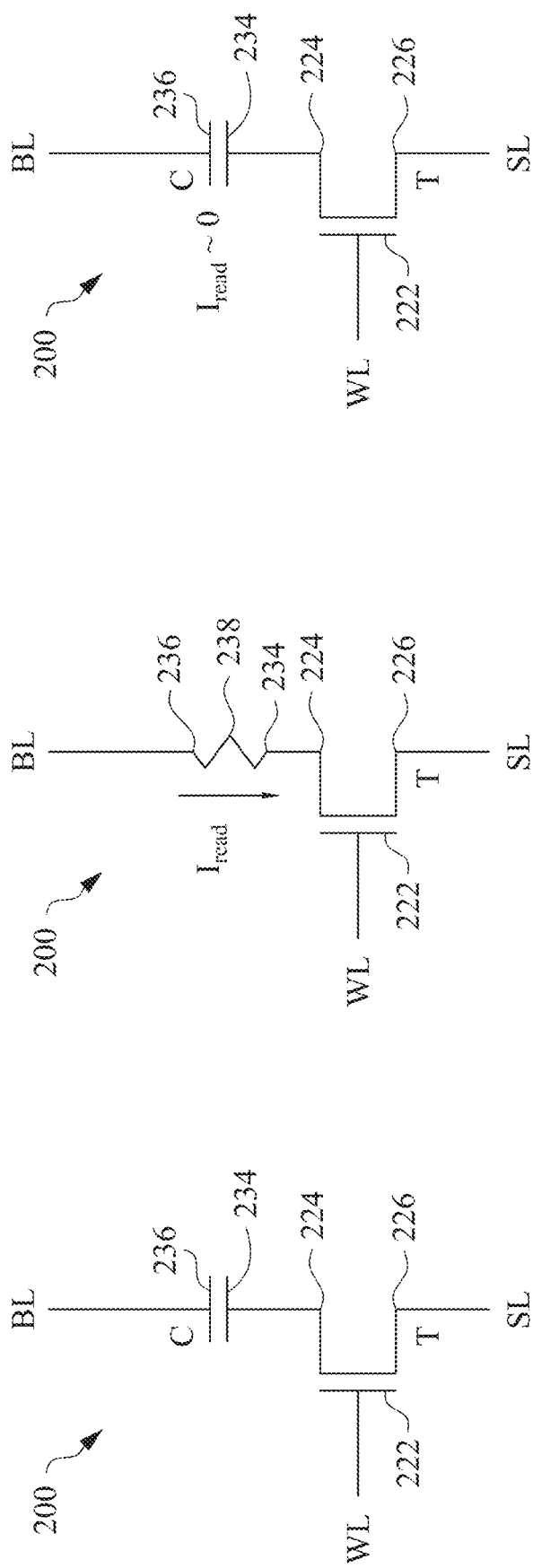
FIGS. 2A-2C are schematic circuit diagrams of a memory cell in various operations, in accordance with some embodiments.

FIGS. 2A-2C are schematic circuit diagrams of a memory cell 200 in various operations, in accordance with some embodiments. In at least one embodiment, the memory cell 200 corresponds to at least one of the memory cells MC in the memory device 100.

In FIG. 2A, the memory cell 200 comprises a capacitor C and a transistor T. The transistor T has a gate terminal 222 coupled to a word line WL, a first terminal 224, and a second terminal 226. The capacitor C has a first end 234 coupled to the first terminal 224 of the transistor T, a second end 236 coupled to a bit line BL, and an insulating material (not shown in FIG. 2A) between the first end 234 and the second end 236. The insulating material is configured to break down under a predetermined break-down voltage or higher applied between the first end 234 and the second end 236.

In the example configuration in FIG. 1A, the second terminal 226 is coupled to a source line SL. In other words, the capacitor C and the transistor T are coupled in series between the bit line BL and the source line SL. In at least one embodiment, the word line WL corresponds to at least one of the word lines WL in the memory device 100, the source line SL corresponds to at least one of the source lines SL in the memory device 100, and the bit line BL corresponds to at least one of the bit lines BL in the memory device 100. In at least one embodiment, the source line SL is omitted, and the second terminal 226 is coupled to a node of a predetermined voltage. Examples of a predetermined voltage include, but are not limited to, a ground voltage VSS, a positive power supply voltage VDD, or the like.

Examples of the transistor T include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. The first terminal 224 is a source/drain of the transistor T, and the second terminal 226 is another source/drain of the transistor T. In the example configuration described with respect to FIG. 2A, the transistor T is an NMOS transistor, the first terminal 224 is a drain and the second terminal 226 is a source of the transistor T. Other configurations including PMOS transistors instead of NMOS transistors are within the scopes of various embodiments.

An example of the capacitor C includes, but is not limited to, an MIM capacitor. Other capacitor configurations, e.g., MOS capacitor, are within the scopes of various embodiments. An MIM capacitor comprises a lower electrode corresponding to one of the first end 234 or the second end 236, an upper electrode corresponding to the other of the first end 234 or the second end 236, and the insulating material sandwiched between the lower electrode and the upper electrode. Example materials of the insulating material include, but are not limited to, silicon dioxide, ZrO, TiO2, HfOx, a high-k dielectric, or the like. Examples of high-k dielectrics include, but are not limited to, zirconium dioxide, hafnium dioxide, zirconium silicate, hafnium silicate, or the like. In at least one embodiment, the insulating material of the capacitor C is the same as or similar to a gate dielectric included in a transistor, such as the transistor T. In at least one embodiment, the transistor T is formed over a semiconductor substrate in a front-end-of-line (FEOL) processing, and then the capacitor C is formed as an MIM capacitor in a back-end-of-line (BEOL) processing over the transistor T. Further example structures and example manufacturing processes of a memory cell in accordance with some embodiments are described with respect to FIGS. 6A-6B and 7A-7D.

In some embodiments, operations of the memory cell 200 are controlled by a controller, such as the controller 102 of the memory device 100.

For example, when the memory cell 200 is selected in a programming operation (also referred to as "write operation"), the controller 102 is configured to apply a turn-ON voltage via the word line WL to the gate terminal 222 of the transistor T to turn ON the transistor T. The controller 102 is further configured to apply a program voltage via the bit line BL to the second end 236 of the capacitor C, and apply a ground voltage VSS to the source line SL. In at least one embodiment, the source line SL is grounded at all times. While the transistor T is turned ON by the turn-ON voltage and electrically couples the first end 234 of the capacitor C to the ground voltage VSS on the source line SL, the program voltage applied to the second end 236 from the bit line BL causes a predetermined break-down voltage or higher to be applied between the first end 234 and the second end 236 of the capacitor C. As a result, a short circuit occurs in the insulating material of the capacitor C under the applied break-down voltage or higher. In other words, the insulating material is broken down and becomes a resistive structure, for example, as described with respect to FIG. 2B. The broken down insulating material corresponds to a first datum, or a first logic value, stored in the memory cell 200. In at least one embodiment, the first datum corresponding to the broken down insulating material is logic "0."

When the memory cell 200 is not selected in a programming operation, the controller 102 is configured to not apply at least one of the turn-ON voltage, the program voltage or the ground voltage VSS to the corresponding gate terminal 222, bit line BL or source line SL. As result, the insulating material of the capacitor C is not broken down, and the capacitor C remains a capacitive structure, for example, as described with respect to FIG. 2C. The insulating material not yet broken down corresponds to a second datum, or a second logic value, stored in the memory cell 200. In at least one embodiment, the second datum corresponding to the insulating material not yet broken down is logic "1."

When the memory cell 200 is selected in a read operation, the controller 102 is configured to apply a turn-ON voltage via the word line WL to the gate terminal 222 of the transistor T to turn ON the transistor T. The controller 102 is further configured to apply a read voltage via the bit line BL to the second end 236 of the capacitor C, and apply a ground voltage VSS to the source line SL. In at least one embodiment, the source line SL is grounded at all times. While the transistor T is turned ON by the turn-ON voltage and electrically couples the first end 234 of the capacitor C to the ground voltage VSS on the source line SL, the controller 102 is configured to sense, e.g., by using the SA 118, a current flowing in the memory cell 200 to detect the datum stored in the memory cell 200.

In FIG. 2B, when the memory cell 200 has been previously programmed to store logic "0," the insulating material of the capacitor C has been broken down and become a resistive structure 238, the read voltage applied to the bit line BL causes a current Iread to flow through the resistive structure 238 and the turned ON transistor T to the ground voltage VSS at the source line SL. The SA 118 is configured to sense the current Iread. The controller 102 is configured to detect, based on the sensed current Iread, that the memory cell 200 stores logic "0."

In FIG. 2C, when the memory cell 200 has been not previously programmed, the memory cell 200 stores logic "1," the insulating material of the capacitor C is not yet broken down, and the capacitor C remains a capacitive structure. The read voltage applied to the bit line BL is lower than the breakdown voltage, and causes no current, or a current Iread close to zero, to flow through the capacitor C and the turned ON transistor T to the ground at the source line SL. The SA 118 is configured to sense that there is no current, or a current Iread close to zero, that flows through the memory cell 200. Accordingly, the controller 102 is configured to detect that the memory cell 200 stores logic "1."

In at least one embodiment, the turn-ON voltage in the program operation is the same as the turn-ON voltage in the read operation. Other configurations where different turn-ON voltages are applied in different operations are within the scopes of various embodiments. The read voltage is lower than the program voltage. In at least one embodiment, the program voltage is about 1.2 V or less, the breakdown voltage is about 1.2 V, and the read voltage is about 0.75 V. Other voltage schemes are within the scopes of various embodiments.

In some embodiments, memory cells having the described 1T1C configuration make it possible to achieve one or more advantages over other approaches including, but not limited to, smaller chip area (i.e., the area occupied by the memory cell on a wafer), lower program voltage, lower disturb voltage, improved reliability, enhanced data security, or the like.

For example, a memory cell in accordance with other approaches that use gate oxide anti-fuses occupies a chip area of about 0.066 $\mu m^2$, and has a program voltage of about 3.5 V, a program disturb voltage of about 2.0 V, and a read disturb voltage of about 1.3 V. In contrast, an example memory cell having the 1T1C configuration in accordance with some embodiments occupies a smaller chip area of about 0.038 $\mu m^2$, has a lower program voltage of about 1.2 V, as well as a lower disturb voltage. The higher program voltage of memory cells that use gate oxide anti-fuses raises reliability concerns. The lower program voltage of memory cells in accordance with some embodiments results in lower stress in the memory cells, and therefore improves reliability. Memory cells in accordance with some embodiments are further applicable to advanced process nodes. In contrast, memory cells that use gate oxide anti-fuses experience scalability and/or manufacturability issues at advanced process nodes.

For another example, a memory cell in accordance with other approaches that use metal fuses occupies a chip area of about 1.663 µm², and has a program voltage of about 1.8 V. In contrast, an example memory cell having the 1T1C configuration in accordance with some embodiments occupies a smaller chip area of about 0.038 µm², which corresponds to a reduction of over 90% in chip area. The lower program voltage of memory cells in accordance with some embodiments results in lower stress in the memory cells, and therefore improves reliability over memory cells that use metal fuses. Further, memory cells that use metal fuses have data security concerns which are obviated in memory cells in accordance with some embodiments. Moreover, memory cells in accordance with some embodiments are applicable to advanced process nodes. In contrast, memory cells that use gate oxide anti-fuses or metal fuses experience scalability and/or manufacturability issues at advanced process nodes.

Figure 3:
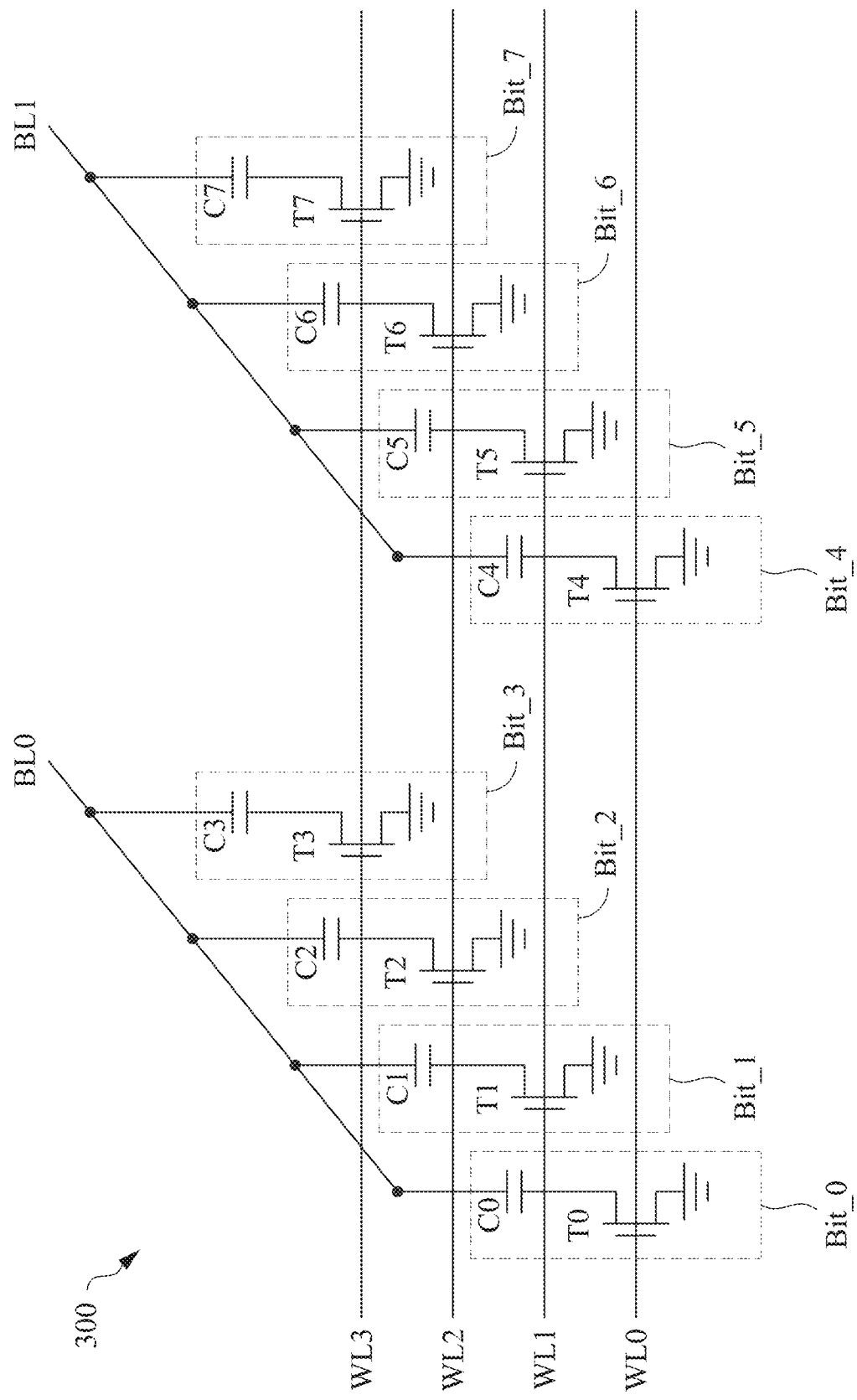
FIG. 3 is a schematic circuit diagram of a memory device, in accordance with some embodiments.

FIG. 3 is a schematic circuit diagram of a memory device 300, in accordance with some embodiments.

The memory device 300 comprises a plurality of memory cells Bit_0, Bit_1, . . . Bit_7. Each of the memory cells Bit_0, Bit_1, . . . Bit_7 has a 1T1C configuration of the memory cell 200 with the source line SL grounded, and comprises a transistor and a capacitor coupled in series between a corresponding bit line and the ground. For example, the memory cells Bit_0, Bit_1, . . . Bit_7 correspondingly comprise capacitors C0, C1, . . . C7, and transistors T0, T1, . . . T7. The capacitors C0, C1, C2, C3 of the memory cells Bit_0, Bit_1, Bit_2, Bit_3 are commonly coupled to a bit line BL0. Gate terminals of the transistors T0, T1, T2, T3 are correspondingly coupled to word lines WL0, WL1, WL2, WL3. The capacitors C4, C5, C6, C7 of the memory cells Bit_4, Bit_5, Bit_6, Bit_7 are commonly coupled to a bit line BL1. Gate terminals of the transistors T4, T5, T6, T7 are correspondingly coupled to the word lines WL0, WL1, WL2, WL3. The memory cells Bit_0, Bit_1, Bit_2, Bit_3 commonly coupled to the bit line BL0 correspond to a first string of memory cells, and the memory cells Bit_4, Bit_5, Bit_6, Bit_7 commonly coupled to the bit line BL1 correspond to a second string of memory cells. In at least one embodiment, each of the memory cells Bit_0, Bit_1, . . . Bit_7 corresponds to a memory cell MC, each of the bit lines BL0, BL1 corresponds to a bit line BL, and each of the word lines WL0, WL1, WL2, WL3 corresponds to a word line WL in the memory device 100. In at least one embodiment, one or more advantages described herein are achievable in the memory device 300.

FIGS. 4A-4D are schematic views at various layers in an IC layout diagram 400 of a memory device, in accordance with some embodiments. In at least one embodiment, the IC layout diagram 400 includes the memory cells Bit_0, Bit_1, Bit_2, Bit_3 of the memory device 300. The memory cells Bit_0, Bit_1, Bit_2, Bit_3 are arranged in abutment with each other. A boundary of the memory cell Bit_2 is shown in FIGS. 4A-4D, whereas boundaries of the memory cells Bit_0, Bit_1, and Bit_3 are omitted in FIGS. 4A-4D for simplicity. In at least one embodiment, the IC layout diagram 400, and/or the layout diagram of one or more of the memory cells Bit_0, Bit_1, Bit_2, Bit_3 are stored in a standard cell library on a non-transitory computer-readable medium.

Figure 4A:
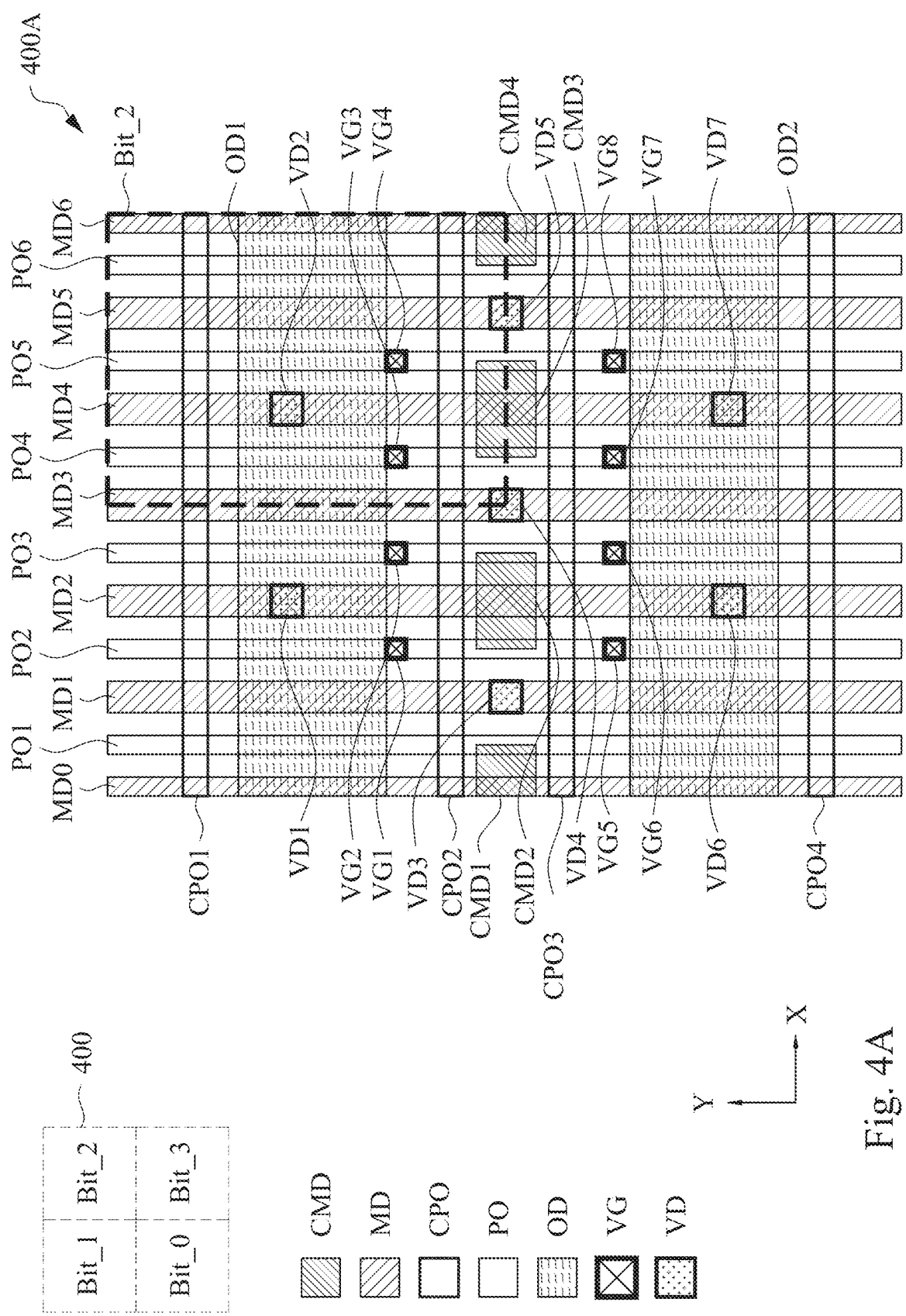
FIGS. 4A-4D are schematic views at various layers in an IC layout diagram of a memory device, in accordance with some embodiments.

FIG. 4A includes a schematic view 400A at a device level of the IC layout diagram 400. The IC layout diagram 400 comprises a first active region OD1, a second active region OD2, gate regions PO1, PO2 . . . PO6, conductive regions MD0, MD1 . . . MD6. The first active region OD1 and the second active region OD2 extend along a first direction, i.e., X direction. Active regions are sometimes referred to as oxide-definition (OD) regions, and are schematically illustrated in the drawings with the label "OD." The X direction is sometimes referred to as the OD direction. The first active region OD1 and the second active region OD2 include P-type dopants and/or N-type dopants to form one or more circuit elements or devices. Examples of circuit elements include, but are not limited to, transistors and diodes. An active region configured to form one or more PMOS devices therein is referred to as "PMOS active region," and an active region configured to form one or more NMOS devices therein is referred to as "NMOS active region." For example, the first active region OD1 and the second active region OD2 are both NMOS active regions configured to form NMOS transistors in the memory cells Bit_0, Bit_1, Bit_2, Bit_3.

The gate regions PO1, PO2 . . . PO6 extend across the first active region OD1 and the second active region OD2 along a second direction, i.e., Y direction, which is transverse to the X direction. Each of the gate regions PO1, PO2 . . . PO6 includes a conductive material, such as, polysilicon, and is schematically illustrated in the drawings with the label "PO." The Y direction is sometimes referred to as the Poly direction. Other conductive materials for the gate regions, such as metals, are within the scope of various embodiments. In the example configuration in FIG. 4A, each transistor in FIG. 3 comprises two devices. The transistor T0 (not indicated in FIG. 4A) of the memory cell Bit_0 is configured by the gate regions PO2, PO3 coupled in parallel, and corresponding source/drain regions in the second active region OD2. The transistor T1 (not indicated in FIG. 4A) of the memory cell Bit_1 is configured by the gate regions PO2, PO3 coupled in parallel, and corresponding source/drain regions in the first active region OD1. The transistor T2 (not indicated in FIG. 4A) of the memory cell Bit_2 is configured by the gate regions PO4, PO5 coupled in parallel, and corresponding source/drain regions in the first active region OD1. The transistor T3 (not indicated in FIG. 4A) of the memory cell Bit_3 is configured by the gate regions PO4, PO5 coupled in parallel, and corresponding source/drain regions in the second active region OD2. The gate regions PO1 and PO6 are dummy gate regions.

The IC layout diagram 400 further comprises cut-Poly regions CPO1, CPO2, CPO3, CPO4 extending in the X direction across the gate regions PO1, PO2 . . . PO6, and correspond to regions where the gate regions PO1, PO2 . . . PO6 are not to be formed. The cut-Poly regions CPO1, CPO2, CPO3, CPO4 are schematically illustrated in the drawings with the label "CPO."

The conductive regions MD0, MD1 . . . MD6 extend in the Y direction, and arranged alternatingly with the gate regions PO1, PO2 . . . PO6 in the X direction. The conductive regions MD0, MD1 . . . MD6 overlap and are configured to form electrical connections to the first active region OD1 and the second active region OD2. The conductive regions MD0, MD1 . . . MD6 are referred to herein as "MD regions," i.e., metal-zero-over-oxide regions, and are schematically illustrated in the drawings with the label "MD." An MD region includes a conductive material formed over a corresponding active region to define an electrical connection from one or more devices formed in the active region to other internal circuitry of the memory device or to outside circuitry. In some embodiments, a pitch between adjacent MD regions in the X direction, i.e., a distance in the X direction between center lines of the adjacent MD regions, is equal to a pitch between adjacent gate regions PO1, PO2 . . . PO6 in the X direction.

The regions MD2, MD4 overlap and are configured to form electrical connections to drain regions of the transistors T0, T1, T2, T3 of the memory cells Bit_0, Bit_1, Bit_2, Bit_3 in the first active region OD1 and the second active region OD2.

The regions MD1, MD3, MD5 overlap and are configured to form electrical connections to source regions of the transistors T0, T1, T2, T3 of the memory cells Bit_0, Bit_1, Bit_2, Bit_3 in the first active region OD1 and the second active region OD2.

The regions MD0, MD3, MD6 are arranged along and overlap boundaries of the memory cells Bit_0, Bit_1, Bit_2, Bit_3. In a place-and-route operation (also referred to as "automated placement and routing (APR)") described herein, cells are placed in an IC layout diagram in abutment with each other at their respective boundaries, for example, as schematically illustrated in FIG. 4A.

The IC layout diagram 400 further comprises cut-MD regions CMD1, CMD2, CMD3, CMD4 extending in the X direction across the regions MD0, MD2, MD4, MD6, and correspond to regions where the regions MD0, MD2, MD4, MD6 are not to be formed. The cut-MD regions CMD1, CMD2, CMD3, CMD4 are schematically illustrated in the drawings with the label "CMD."

The IC layout diagram 400 further comprises conductive vias over and in electrical contact with the corresponding gate regions or MD regions. A via over and in electrical contact with an MD region is sometimes referred to as via-to-device, and is schematically illustrated in the drawings with the label "VD." A via over and in electrical contact with a gate region is sometimes referred to as via-to-gate, and is schematically illustrated in the drawings with the label "VG." In the example configuration in FIG. 4A, the IC layout diagram 400 comprises vias VD1, VD2, . . . VD7, and vias VG1, VG2, . . . VG8.

The vias VD6, VD1, VD2, VD7 are in electrical contact with the regions MD2, MD4 over the first active region OD1 and the second active region OD2, and are configured to electrically couple the drain regions of the transistors T0, T1, T2, T3 of the memory cells Bit_0, Bit_1, Bit_2, Bit_3 to one or more upper layers to be coupled with the corresponding capacitors C0, C1, C2, C3 of the memory cells Bit_0, Bit_1, Bit_2, Bit_3, as described herein.

The vias VD3, VD4, VD5 are in electrical contact with the regions MD1, MD3, MD5, and are configured to electrically couple the source regions of the transistors T0, T1, T2, T3 of the memory cells Bit_0, Bit_1, Bit_2, Bit_3 to one or more upper layers, e.g., to a layer containing a conductive pattern having the ground voltage VSS.

The vias VG5, VG6 are in electrical contact with the gate regions PO2, PO3 in the memory cell Bit_0, and are configured to electrically couple a gate of the transistor T0 of the memory cell Bit_0 to one or more upper layers, to be coupled with the corresponding word line WL0, as described herein. The transistor T0 has a gate configured by the gate regions PO2, PO3 coupled in parallel, a drain coupled to the region MD2, and a source coupled to the regions MD1, MD3.

The vias VG1, VG2 are in electrical contact with the gate regions PO2, PO3 in the memory cell Bit_1, and are configured to electrically couple a gate of the transistor T1 of the memory cell Bit_1 to one or more upper layers, to be coupled with the corresponding word line WL1, as described herein. The transistor T1 has a gate configured by the gate regions PO2, PO3 coupled in parallel, a drain coupled to the region MD2, and a source coupled to the regions MD1, MD3.

The vias VG3, VG4 are in electrical contact with the gate regions PO4, PO5 in the memory cell Bit_2, and are configured to electrically couple a gate of the transistor T2 of the memory cell Bit_2 to one or more upper layers, to be coupled with the corresponding word line WL2, as described herein. The transistor T2 has a gate configured by the gate regions PO4, PO5 coupled in parallel, a drain coupled to the region MD4, and a source coupled to the regions MD3, MD5.

The vias VG7, VG8 are in electrical contact with the gate regions PO4, PO5 in the memory cell Bit_3, and are configured to electrically couple a gate of the transistor T3 of the memory cell Bit_3 to one or more upper layers, to be coupled with the corresponding word line WL3, as described herein. The transistor T3 has a gate configured by the gate regions PO4, PO5 coupled in parallel, a drain coupled to the region MD4, and a source coupled to the regions MD3, MD5.

Figure 4B:
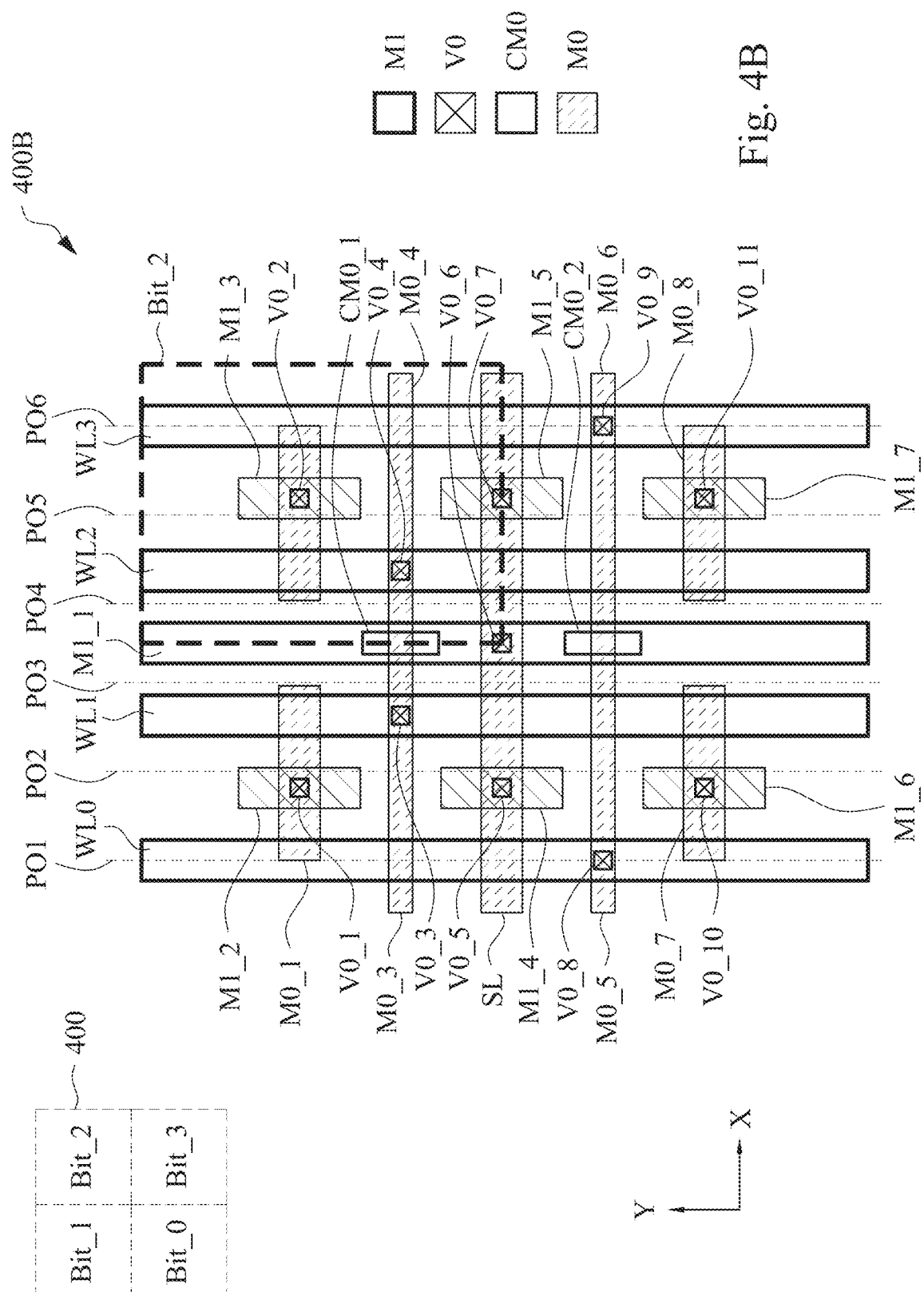

FIG. 4B is a schematic view 400B at M0 and M1 layers of the IC layout diagram 400. The M0 layer, i.e., metal-zero (M0) layer, is the lowermost metal layer immediately over and in electrical contact with the VD and VG vias, and is schematically illustrated in the drawings with the label "M0." The M1 layer is the metal layer immediately over the M0 layer, and is schematically illustrated in the drawings with the label "M1." The IC layout diagram 400 further comprises other metal layers sequentially stacked over the M1 layer, and are schematically illustrated in the drawings with the corresponding labels such as "M2," "M5," "M6," and "M7." The layout diagram 400 also comprises via layers arranged between and electrically couple successive metal layers. A via layer Vn is arranged between and electrically couple the Mn layer and the Mn+1 layer, where n is an integer form zero and up. For example, a via-zero (V0) layer is the lowermost via layer which is arranged between and electrically couple the M0 layer and the M1 layer, and is schematically illustrated in the drawings with the label "V0." Other via layers are schematically illustrated in the drawings with the corresponding labels such as "V1," "V5," and "V6." For simplicity, the gate regions PO1, PO2 . . . PO6 are schematically illustrated in FIG. 4B by the corresponding center lines, also referred to as "gate tracks."

The M0 layer comprises conductive patterns M0_1, M0_2, . . . M0_8, and SL. The IC layout diagram 400 further comprises cut-M0 regions CM0_1, CM0_2 correspond to regions where the M0 layer is not to be formed. The cut-M0 regions CM0_1, CM0_2 are schematically illustrated in the drawings with the label "CM0."

The patterns M0_7, M0_1, M0_2, M0_8 are over and electrical contact with the corresponding vias VD6, VD1, VD2, VD7, and are configured to electrically couple the drain regions of the transistors T0, T1, T2, T3 of the memory cells Bit_0, Bit_1, Bit_2, Bit_3 to one or more upper layers to be coupled with the corresponding capacitors C0, C1, C2, C3 of the memory cells Bit_0, Bit_1, Bit_2, Bit_3, as described herein.

The patterns M0_3, M0_4 are electrically isolated from each other by the cut-M0 region CM0_1, and the patterns M0_5, M0_6 are electrically isolated from each other by the cut-M0 region CM0_2. The pattern M0_3 is over and in electrical contact with the vias VG1, VG2 to couple the gate regions PO2, PO3 of the transistor T1 of the memory cell Bit_1 in parallel. The pattern M0_4 is over and in electrical contact with the vias VG3, VG4 to couple the gate regions PO4, PO5 of the transistor T2 of the memory cell Bit_2 in parallel. The pattern M0_5 is over and in electrical contact with the vias VG5, VG6 to couple the gate regions PO2, PO3 of the transistor T0 of the memory cell Bit_0 in parallel. The pattern M0_6 is over and in electrical contact with the vias VG7, VG8 to couple the gate regions PO4, PO5 of the transistor T3 of the memory cell Bit_3 in parallel. The patterns M0_5, M0_3, M0_4, M0_6 are configured to couple the gate regions of the transistors T0, T1, T2, T3 of the memory cells Bit_0, Bit_1, Bit_2, Bit_3 to the corresponding word lines WL0, WL1, WL2, WL3, as described herein.

The pattern SL is over and in electrical contact with vias VD3, VD4, VD5, and is configured to electrically couple the source regions of the transistors T0, T1, T2, T3 of the memory cells Bit_0, Bit_1, Bit_2, Bit_3 to the ground voltage VSS. In at least one embodiment, the pattern SL corresponds to a source line SL described with respect to FIGS. 1 and 2A-2C.

The M1 layer comprises conductive patterns M1_1, M1_2, . . . M1_7, and word line patterns WL0, WL1, WL2, WL3. The V0 layer comprises vias V0_1, V0_2, . . . V0_11 arranged between and electrically couple corresponding patterns of the M0 layer and the M1 layer.

The patterns M0_7, M0_1, M0_2, M0_8 are correspondingly coupled to the patterns M1_6, M1_2, M1_3, M1_7 through the corresponding vias V0_10, V0_1, V0_2, V0_11, to electrically couple the drain regions of the transistors T0, T1, T2, T3 of the memory cells Bit_0, Bit_1, Bit_2, Bit_3 with the corresponding capacitors C0, C1, C2, C3 of the memory cells Bit_0, Bit_1, Bit_2, Bit_3, as described herein.

The patterns M0_5, M0_3, M0_4, M0_6 are correspondingly coupled to the word line patterns WL1, WL2, WL0, WL3 through the corresponding vias V0_8, V0_3, V0_4, V0_9, to electrically couple the gate regions of the transistors T0, T1, T2, T3 of the memory cells Bit_0, Bit_1, Bit_2, Bit_3 with the corresponding word line patterns WL0, WL1, WL2, WL3. In at least one embodiment, the word line patterns WL0, WL1, WL2, WL3 correspond to word lines WL0, WL1, WL2, WL3 described with respect to FIG. 3, and/or are coupled through further vias and/or metal layers to word lines described with respect to FIGS. 1 and 2A-2C.

The pattern SL is coupled to the patterns M1_4, M1_1, M1_5 through the corresponding vias V0_5, V0_6, V0_7. The patterns M1_4, M1_1, M1_5 are for further routing (or promoting) the pattern SL to the M2 layer.

Figure 4C:
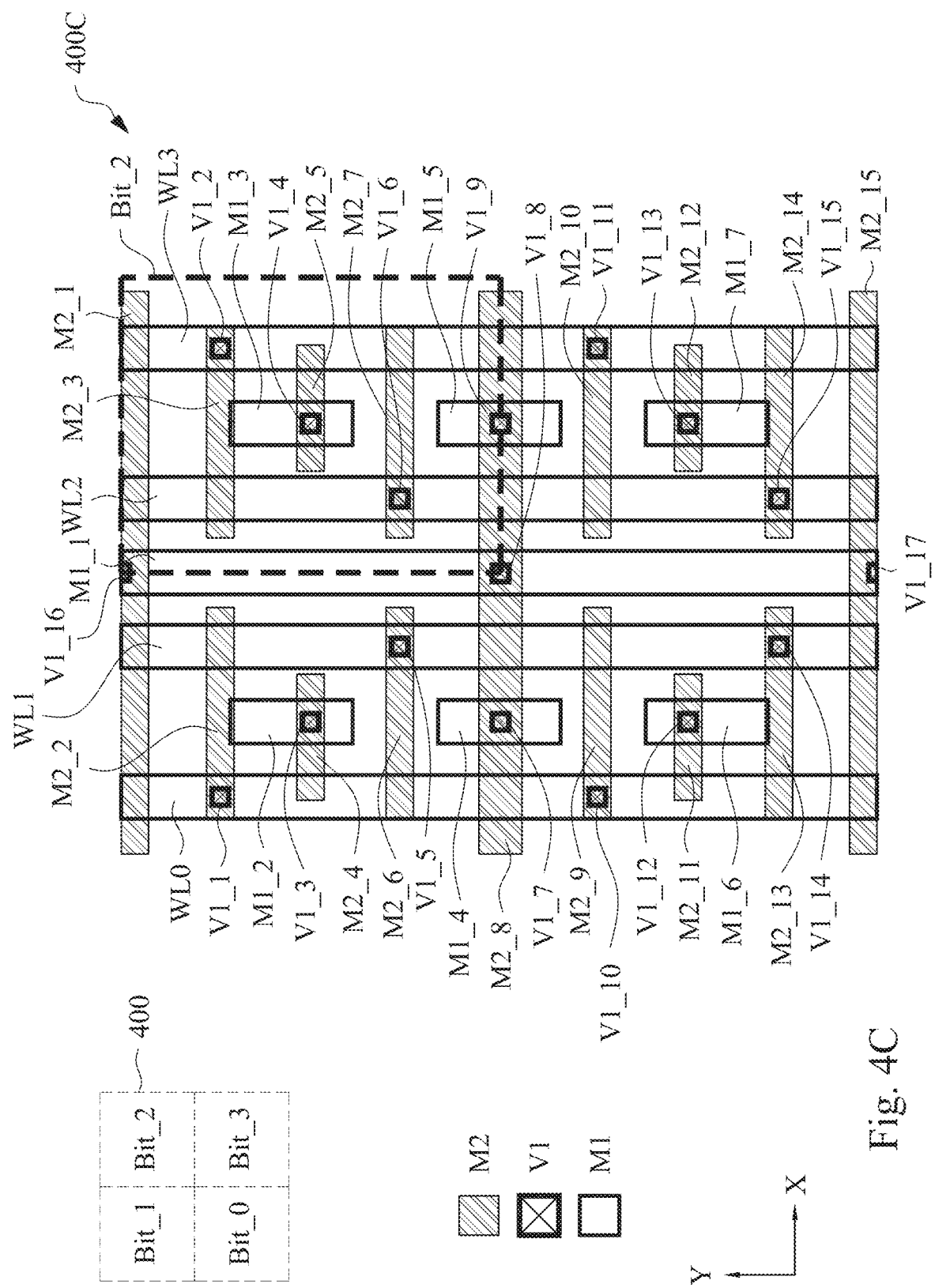

FIG. 4C is a schematic view 400C at M1 and M2 layers of the IC layout diagram 400. The schematic view 400C also shows a via layer, i.e., the V1 layer, between the M1 layer and the M2 layer. The M2 layer comprises conductive patterns M2_1, M2_2, . . . M2_15, and the V1 layer comprises vias V1_1, V1_2, . . . V1_17.

The patterns M2_2, M2_3, M2_6, M2_7 are correspondingly coupled to the word line patterns WL0, WL3, WL1, WL2 on the M1 layer through the corresponding vias V1_1, V1_2, V1_5, V1_6.

The patterns M2_9, M2_10, M2_13, M2_14 are correspondingly coupled to the word line patterns WL0, WL3, WL1, WL2 on the M1 layer through the corresponding vias V1_10, V1_11, V1_14, V1_15.

The patterns M2_11, M2_4, M2_5, M2_12 are correspondingly coupled to the patterns M1_6, M1_2, M1_3, M1_7 on the M1 layer through the corresponding vias V1_12, V1_3, V1_4, V1_13, to electrically couple the drain regions of the transistors T0, T1, T2, T3 of the memory cells Bit_0, Bit_1, Bit_2, Bit_3 with the corresponding capacitors C0, C1, C2, C3 of the memory cells Bit_0, Bit_1, Bit_2, Bit_3, as described herein.

The pattern M2_8 is coupled to the patterns M1_4, M1_1, M1_5 on the M1 layer through the corresponding vias V1_7, V1_8, V1_9.

The patterns M2_1, M2_15 are on the boundaries of the memory cells Bit_0, Bit_1, Bit_2, Bit_3, and are coupled to the pattern M1_1 on the M1 layer through the corresponding vias V1_16, V1_17.

In at least one embodiment, conductive patterns similar to those of the M1 layer are repeated in the M3 layer and the M5 layer, and conductive patterns similar to those of the M2 layer are repeated in the M4 layer. The via layers, i.e., the V2 layer, V3 layer, and V4 layer, are configured to electrically couple corresponding conductive patterns of the successive metal layers in a manner similar to that described with respect to FIG. 4C. As a result the M5 layer comprises conductive patterns corresponding to and electrically coupled with conductive patterns of the M1 layer, as described herein.

Figure 4D:
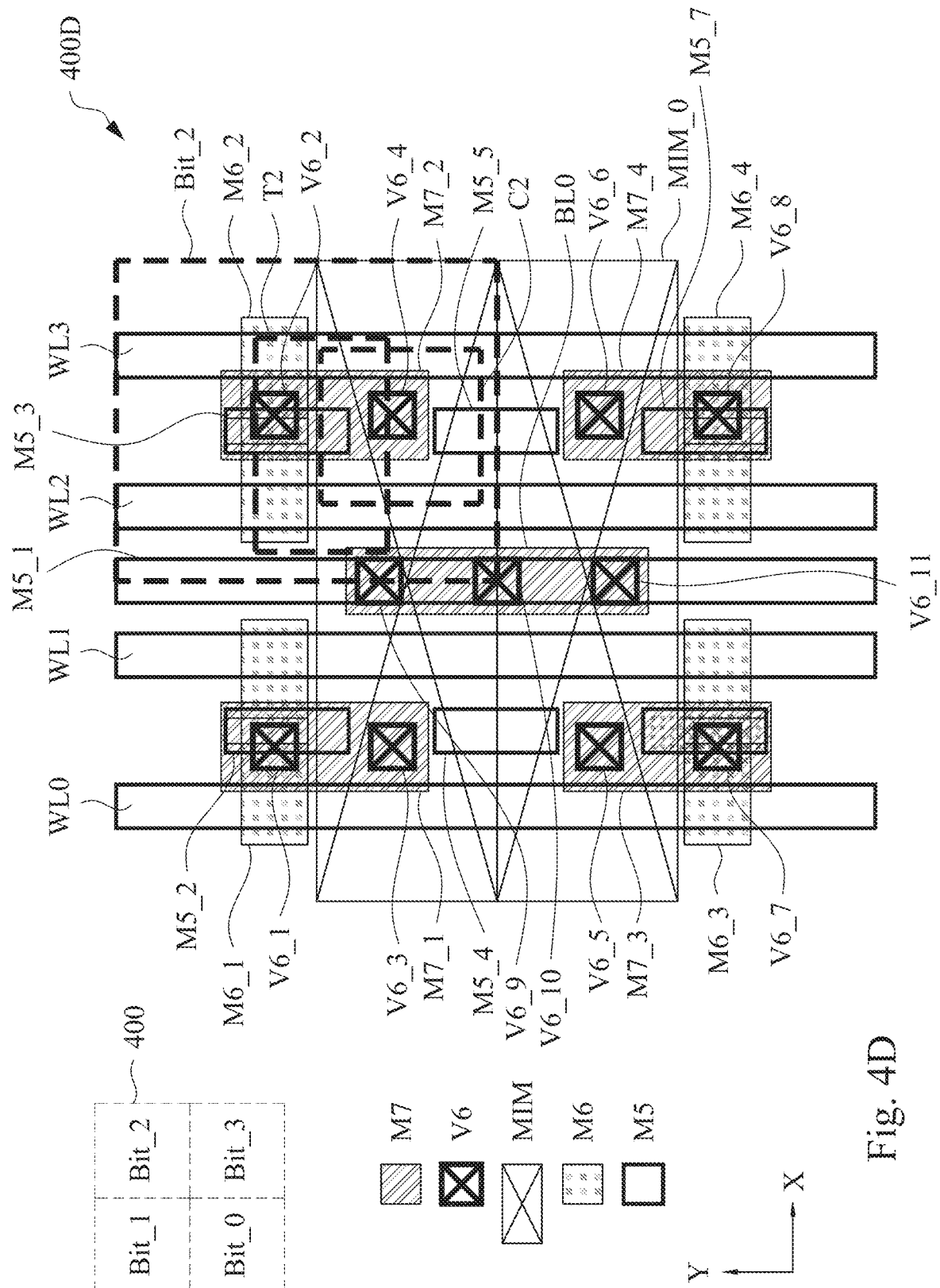

FIG. 4D is a schematic view 400D at M5, M6 and M7 layers of the IC layout diagram 400. The schematic view 400D also shows a via layer, i.e., the V6 layer, between the M6 layer and the M7 layer. For simplicity, the V5 layer, between the M5 layer and the M6 layer is omitted.

The IC layout diagram 400 further comprises a MIM layer schematically illustrated in the drawings with the label "MIM." The MIM layer comprises a multilayer structure MIM_0 having at least a lower electrode, an upper electrode and an insulating material sandwiched between the lower electrode and the upper electrode. A boundary of the upper electrode and the insulating material of the structure MIM_0 in the memory cell Bit_2 is schematically indicated by a rectangle C2 in FIG. 4D, and corresponds to the capacitor C2 of the memory cell Bit_2. A boundary of the transistor T2 in the memory cell Bit_2 is schematically indicated by a rectangle T2 in FIG. 4D. As illustrated in FIG. 4D, the capacitor C2 overlaps at least partially the transistor T2. The boundaries of the upper electrode and the insulating material of the structure MIM_0 in the capacitors C0, C1, C3 as well as the boundaries of the corresponding transistors T0, T1, T3 in the other memory cells Bit_0, Bit_1, Bit_3 are similarly configured. The upper electrode and the insulating material of each capacitor are therefore isolated from the upper electrodes and the insulating materials of the other capacitors in the memory cells Bit_0, Bit_1, Bit_2, Bit_3. The lower electrode extends continuously in and between the memory cells Bit_0, Bit_1, Bit_2, Bit_3, is configured as a common electrode for the capacitors C0, C1, C2, C3 of the memory cells Bit_0, Bit_1, Bit_2, Bit_3, and is electrically coupled to the bit line BL0 as described herein. The structure MIM_0 is described in detail herein with respect to FIGS. 6A-6B.

The M5 layer comprises conductive patterns M5_1, M5_2, . . . M5_7, and word line patterns WL0, WL1, WL2, WL3 which corresponding to and are electrically coupled with the patterns M1_1, M1_2, . . . M1_7 and word line patterns WL0, WL1, WL2, WL3 in the M1 layer.

The M6 layer comprises conductive patterns M6_1, M6_2, M6_3, M6_4 correspondingly coupled to the patterns M5_2, M5_3, M5_6, M5_7 through corresponding vias (not shown) in the V5 layer. As a result, the patterns M6_3, M6_1, M6_2, M6_4 are correspondingly coupled to the drain regions of the transistors T0, T1, T2, T3 of the memory cells Bit_1, Bit_2, Bit_0, Bit_3.

The M7 layer comprises conductive patterns M7_1, M7_2, M7_3, M7_4, and bit line pattern BL0. The V6 layer comprises vias V6_1, V6_2, . . . V6_11.

The patterns M7_1, M7_2, M7_3, M7_4 are correspondingly coupled to the patterns M6_1, M6_2, M6_3, M6_4 through the corresponding vias V6_1, V6_2, V6_7, V6_8. As a result, the patterns M7_3, M7_1, M7_2, M7_4 are correspondingly coupled to the drain regions of the transistors T0, T1, T2, T3 of the memory cells Bit_1, Bit_2, Bit_0, Bit_3.

The patterns M7_1, M7_2, M7_3, M7_4 are further correspondingly coupled through the corresponding vias V6_3, V6_4, V6_5, V6_6 to the upper electrodes in the structure MIM_0. For example, the patterns M7_2 is coupled through the corresponding vias V6_4 to the upper electrode of the capacitor C2 in the memory cell Bit_2. As a result, the drain region of the transistor T2 is coupled to the upper electrode, or the first end, of the capacitor C2 in the memory cell Bit_2 sequentially through the MD region MD4, the via VD2, the pattern M0_2, the via V0_2, the pattern M1_3, the via V1_4, the pattern M2_5, corresponding vias and patterns in the V2, M3, V3, M4, V4 layers, the pattern M5_3, the corresponding via in the V5 layer, the pattern M6_2, the via V6_2, the pattern M7_2, and the via V6_4. The drain regions of the transistors T0, T1, T3 of the other memory cells Bit_0, Bit_1, Bit_3 are coupled in a similar manner to the upper electrodes, or the first end, of the corresponding capacitors C0, C1, C3.

The bit line pattern BL0 is coupled through the vias V6_9, V6_10, V6_11 to the common lower electrode, or the second end, of the capacitors C0, C1, C2, C3 of the memory cells Bit_0, Bit_1, Bit_2, Bit_3. In at least one embodiment, the bit line pattern BL0 corresponds to the bit line BL0 described with respect to FIG. 3, and/or is coupled through further vias and/or metal layers to a bit line described with respect to FIGS. 1 and 2A-2C.

In at least one embodiment, the memory cells Bit_0, Bit_1, Bit_2, Bit_3 have symmetric configurations with respect to each other. For example, the patterns and/or regions in various layers in the memory cell Bit_2 are symmetric across the X direction to the corresponding patterns and/or regions in the corresponding layers in the memory cell Bit_3. In other words, the memory cell Bit_3 is obtainable by flipping the memory cell Bit_2 across the X direction. Similarly, the memory cell Bit_1 is obtainable by flipping the memory cell Bit_0 across the X direction. The memory cell Bit_1 is obtainable by flipping the memory cell Bit_2 across the Y direction. The memory cell Bit_0 is obtainable by flipping the memory cell Bit_3 across the Y direction.

In the example configuration in FIGS. 4A-4D, the source line SL is arranged in one or more even metal layers, the word lines WL0, WL1, WL2, WL3 are arranged in one or more odd metal layers, and the bit line BL0 is arranged in one or more metal layers from the M7 layer and up. For example, the source line SL is arranged in one or more of the M0 layer, the M2 layer or the M4 layer, and the word lines WL0, WL1, WL2, WL3 are arranged in one or more of the M1 layer, the M3 layer or the M5 layer. The described arrangement is an example. Other configurations are within the scopes of various embodiments. Further, in the example configuration in FIGS. 4A-4D, the MIM layer is arranged between the M6 layer and the M7 layer. However, in at least one embodiment, MIM layer is arranged between any two metal layers. In at least one embodiment, one or more advantages described herein are achievable in a memory device corresponding to the IC layout diagram 400.

Figure 5A:
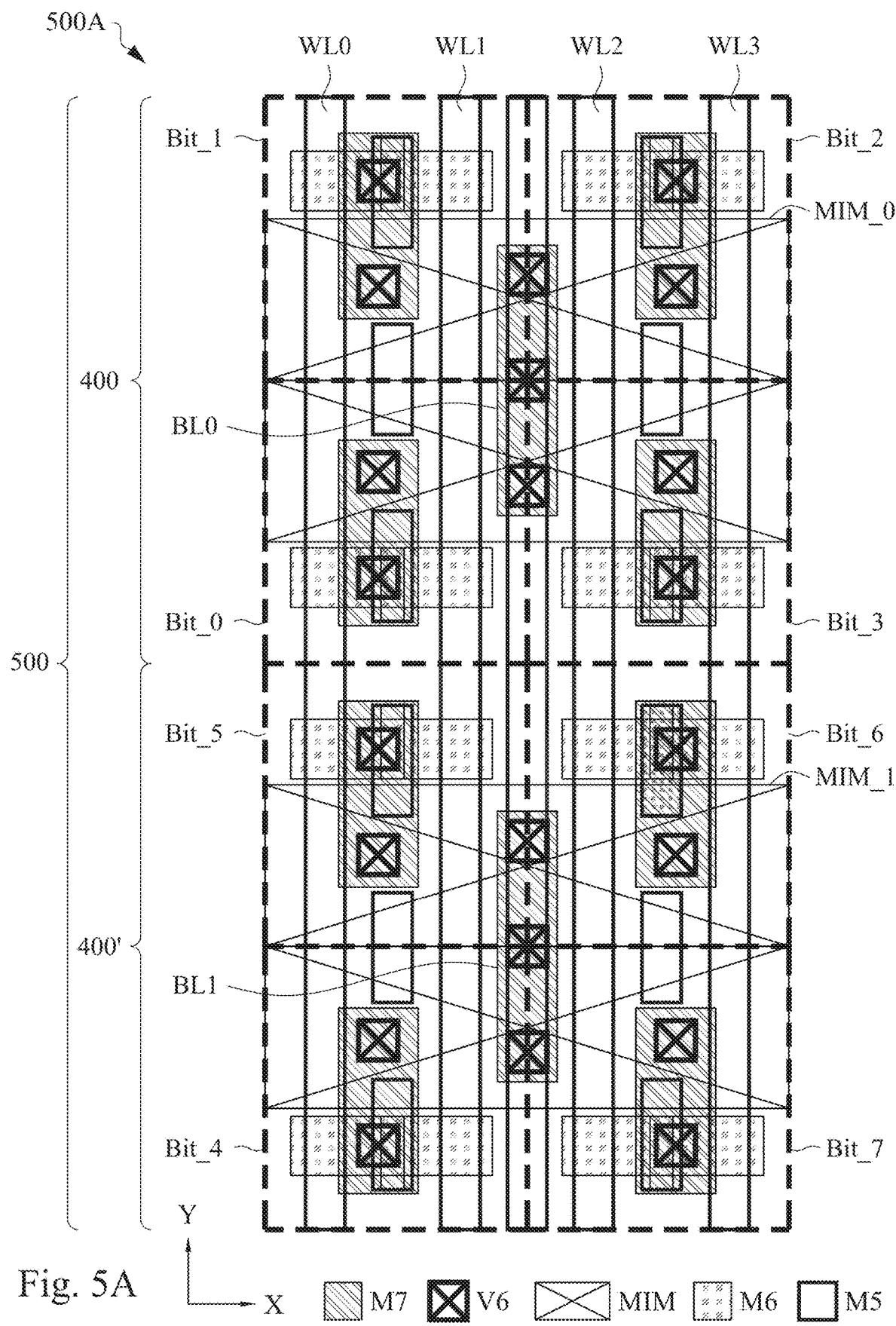
FIG. 5A is a schematic view of an IC layout diagram of a memory device, in accordance with some embodiments.

FIG. 5A is a schematic view 500A of an IC layout diagram 500 of a memory device, in accordance with some embodiments.

In at least one embodiment, the IC layout diagram 500 corresponds to the memory device 300. The IC layout diagram 500 comprises the IC layout diagram 400, and a IC layout diagram 400' identical to the IC layout diagram 400 and arranged in abutment with the IC layout diagram 400 in the Y direction. The IC layout diagram 400' includes the memory cells Bit_4, Bit_5, Bit_6, Bit_7 of the memory device 300. The capacitors of the memory cells Bit_4, Bit_5, Bit_6, Bit_7 are configured by a structure MIM_1 in the MIM layer, and are coupled to a bit line pattern BL1. In at least one embodiment, the bit line pattern BL1 corresponds to the bit line BL1 described with respect to FIG. 3, and/or is coupled through further vias and/or metal layers to a bit line described with respect to FIGS. 1 and 2A-2C.

Figure 5B:
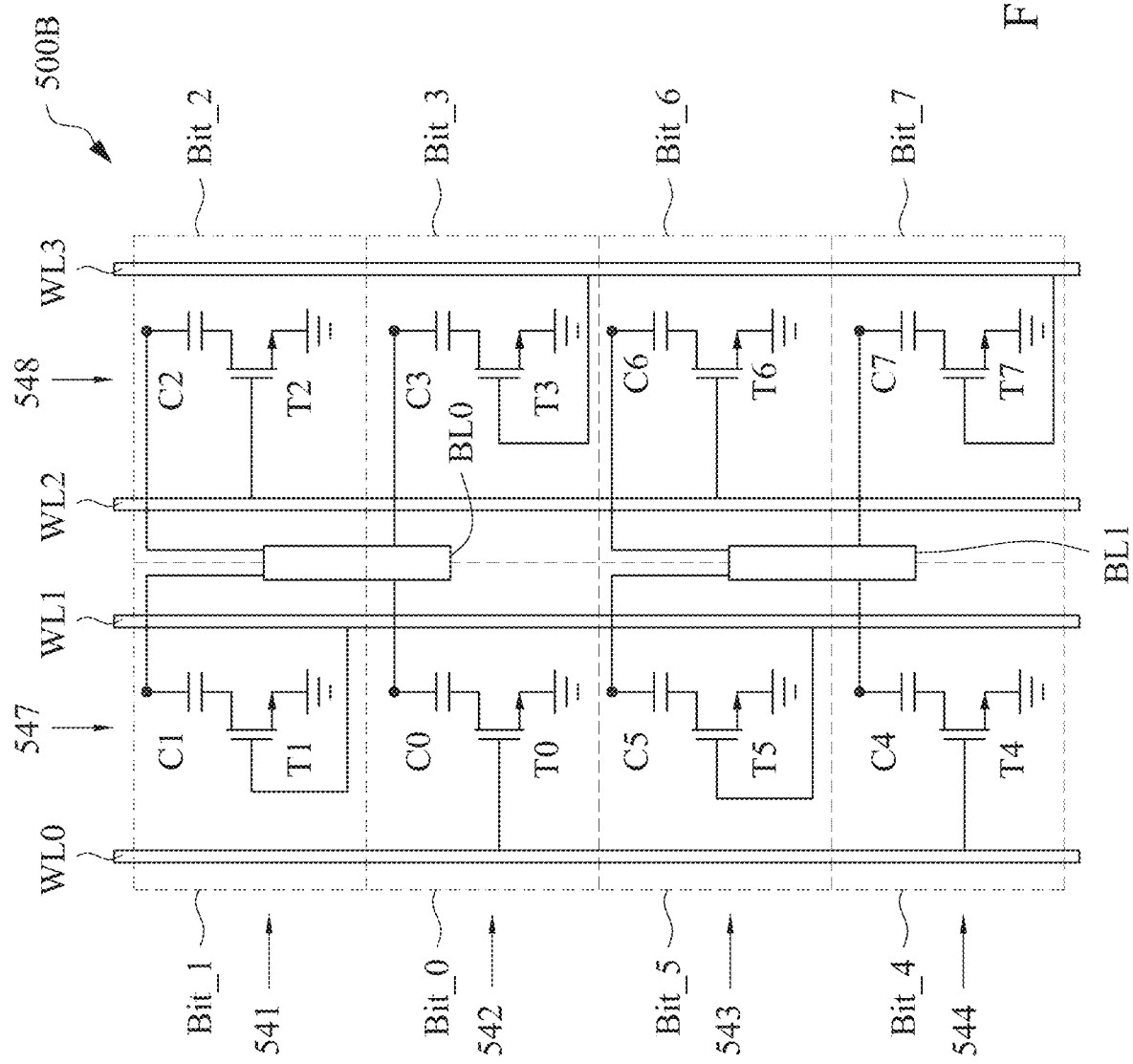
FIG. 5B is a schematic view, including a circuit diagram, of an IC layout diagram of a memory device, in accordance with some embodiments.

FIG. 5B is a schematic view 500B, including a circuit diagram, of the IC layout diagram 500, in accordance with some embodiments.

The schematic view 500B illustrates the capacitors C0, C1, . . . C7 and the transistors T0, T1, . . . T7 in the corresponding memory cells Bit_0, Bit_1, . . . Bit_7. The electrical connections among the capacitors C0, C1, . . . C7, the transistors T0, T1, . . . T7, the word lines WL0, WL1, WL2, WL3, and the bit lines BL0, BL1 are as described with respect to FIG. 3. The physical arrangements (except for sizes and shapes) of the capacitors C0, C1, . . . C7, the transistors T0, T1, . . . T7, the word lines WL0, WL1, WL2, WL3, and the bit lines BL0, BL1 are as described with respect to FIG. 5A.

The transistors T0, T1, . . . T7 are arranged in an array having rows 541, 542, 543, 544, and columns 547, 548. The capacitors C0, C1, . . . C7 are arranged in the same array. Two word lines are arranged in each column. For example, the word lines WL0, WL1 are arranged in the column 547, and the word lines WL2, WL3 are arranged in the column 548.

The gates of transistors in each column are electrically coupled to either of the two word lines arranged in the column. For example, in the column 547, the gates of the transistor T0 and T4 are coupled to the word line WL0, whereas the gates of the transistor T1 and T5 are coupled to the word line WL1. In the column 548, the gates of the transistor T2 and T6 are coupled to the word line WL2, whereas the gates of the transistor T3 and T7 are coupled to the word line WL3.

Each bit line is coupled to the capacitors in two rows. For example, the bit line BL0 is coupled to the capacitors C1, C2 in the row 541, and is also coupled to the capacitors C0, C3 in the row 542. The bit line BL1 is coupled to the capacitors C5, C6 in the row 543, and is also coupled to the capacitors C4, C7 in the row 544. In at least one embodiment, one or more advantages described herein are achievable in a memory device corresponding to the IC layout diagram 500.

Figure 6A:
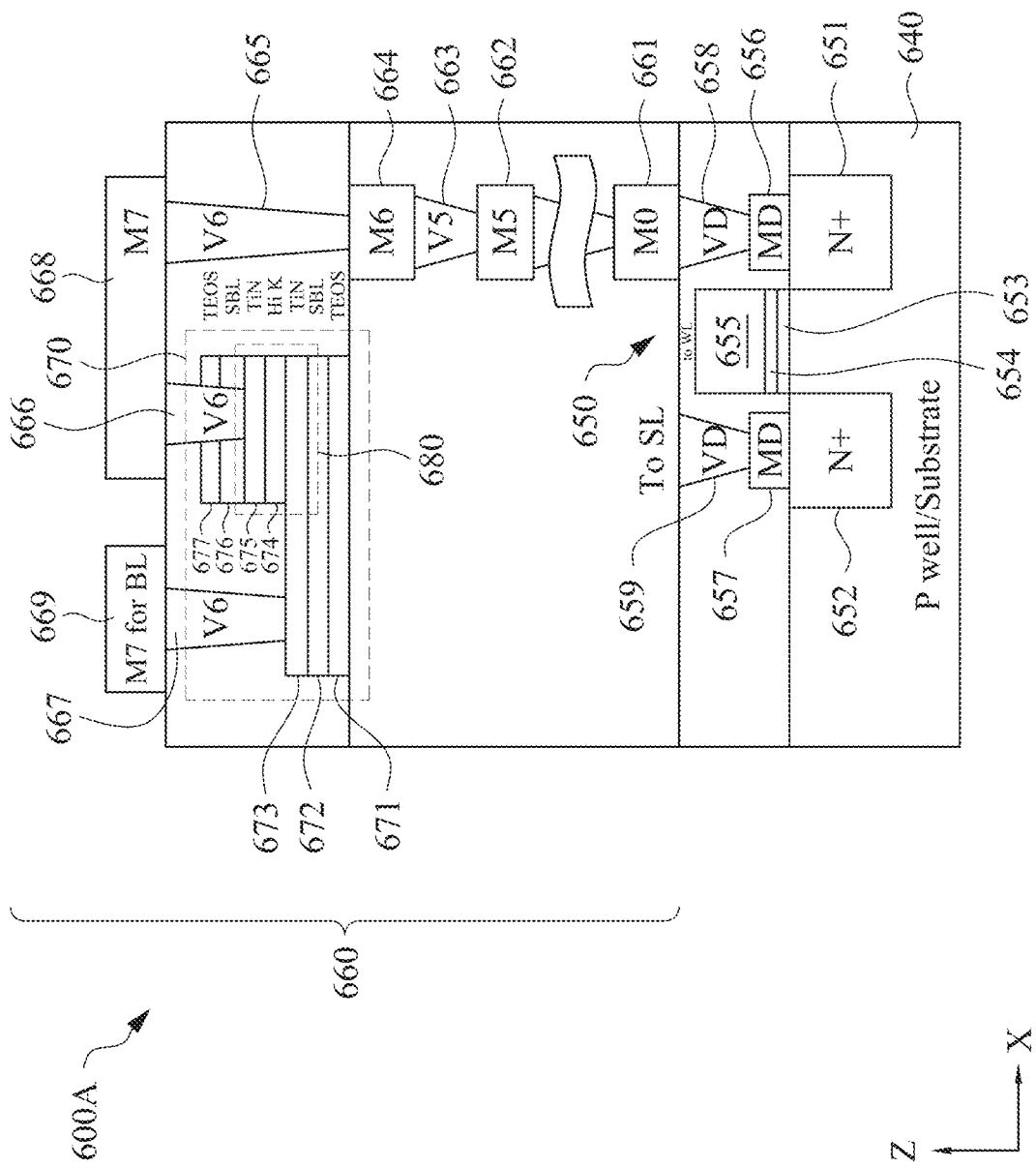
FIGS. 6A-6C are schematic cross-sectional views of various IC devices, in accordance with some embodiments.

FIG. 6A is a schematic cross-sectional view of an IC device 600A, in accordance with some embodiments. In at least one embodiment, the IC device 600A corresponds to one or more of the memory devices and/or IC layout diagrams described with respect to FIGS. 1, 3, 4A-4D, 5A-5B.

The IC device 600A comprises a substrate 640, at least one transistor 650 over the substrate 640, an interconnect structure 660 over the transistor 650 and the substrate 640, and an MIM structure 670 over the transistor 650 and the substrate 640. The MIM structure 670 comprises a capacitor coupled to the transistor 650 to form a memory cell.

In some embodiments, the substrate 640 is a semiconductor substrate. N-type and P-type dopants are added to the substrate to correspondingly form N wells 651, 652, and P wells (not shown). In some embodiments, isolation structures are formed between adjacent P wells and N wells. For simplicity, several features such as P wells and isolation structures are omitted from FIG. 6A.

The transistor 650 comprises a gate region and source/drain regions. The N wells 651, 652 define the source/drain regions of the transistor 650. For example, the N well 651 defines a drain region of the transistor 650 and is referred to herein as drain region 651, and the N well 652 defines a source region of the transistor 650 and is referred to herein as source region 652. The gate region of the transistor 650 comprises a stack of gate dielectric layers 653, 654, and a gate electrode 655. In at least one embodiment, the transistor 650 comprises a gate dielectric layer instead of multiple gate dielectrics. Example materials of the gate dielectric layer or layers include $HfO_2$, $ZrO_2$, or the like. Example materials of the gate electrode 655 include polysilicon, metal, or the like.

The IC device 600A further comprises contact structures configured to electrically couple the transistor 650 to other circuitry in the IC device 600A. The contact structures comprise MD regions 656, 657 correspondingly over and in electrical contact with the drain region 651, source region 652. The contact structures further comprise various vias. For example, a VG via (not shown) is over and in electrical contact with the gate electrode 655, and is configured to couple the gate electrode 655 to a word line WL in the interconnect structure 660, as described herein. VD vias 658, 659 are correspondingly over and in electrical contact with the MD regions 656, 657. The VD via 658 is configured to couple the drain region 651 to the capacitor in the MIM structure 670, as described herein. The VD via 659 is configured to couple the source region 652 to a source line SL in the interconnect structure 660, as described herein.

The interconnect structure 660 comprise a plurality of metal layers M0, M1, . . . and a plurality of via layers V0, V1, . . . arranged alternatingly in a thickness direction, i.e., the Z direction, of the substrate 640. The interconnect structure 660 further comprises various interlayer dielectric (ILD) layers (not shown) in which the metal layers and via layers are embedded. The metal layers and via layers of the interconnect structure 660 are configured to electrically couple various elements or circuits of the IC device 600A with each other, and with external circuitry. Although the M7 layer is illustrated in FIG. 6A at a top level of the interconnect structure 660, the interconnect structure 660 comprises further metal layers and/or via layers higher than the M7 layer, in at least one embodiment.

In the example configuration in FIG. 6A, the interconnect structure 660 comprises the following structures sequentially stacked upward in the Z direction and electrically coupled to the VD via 658: an M0 pattern 661, various patterns and vias (not shown) in layers V0, M1, . . . V4, an M5 pattern 662, a V5 via 663, an M6 pattern 664, and a V6 via 665 in a V6 layer. The V6 layer further comprises V6 vias 666, 667. An overlying M7 layer comprises M7 patterns 668, 669 which are electrically isolated from each other. The M7 pattern 668 electrically couple the V6 via 665 and the V6 via 666. The M7 pattern 669 is coupled to the V6 via 667, and is configured to define or to be coupled to a bit line BL, as described herein.

The MIM structure 670 is arranged over the M6 layer and comprises a multilayer structure. In the example configuration in FIG. 6A, the MIM structure 670 comprises the following layers sequentially stacked upward in the Z direction over the M6 layer: one or more passivation layers 671, 672, a lower conductive layer (or electrode layer) 673, an insulating layer 674, an upper conductive layer 675, and one or more passivation layers 676, 677. For example, the passivation layers 671, 677 comprise TEOS (tetraethyl orthosilicate), the passivation layers 672, 676 comprise SBL (silicidation blocking layers), the conductive layers 673, 675 comprise TiN and/or TaN, and the insulating layer 674 comprises a high-k dielectric as described herein. In at least one embodiment, the multiple passivation layers 671, 672 are replaced with a single passivation layer, and/or the multiple passivation layers 676, 677 are replaced with a single passivation layer. The lower conductive layer 673 is coupled by the V6 via 667 to the M7 pattern 669 for connection to a bit line BL. The insulating layer 674, the upper conductive layer 675 and the one or more passivation layers 676, 677 are patterned to be present under the V6 via 666, but not under the V6 via 667. The V6 via 666 extends through the one or more passivation layers 676, 677 to electrically couple the upper conductive layer 675 to the M7 pattern 668, and therefore, to the drain region 651 of the transistor 650 through various patterns and vias in various metal layers and via layers as described herein.

The lower conductive layer 673, insulating layer 674, and upper conductive layer 675 under the V6 via 666 together define a capacitor 680 in the MIM structure 670. The upper conductive layer 675 corresponds to a first end of the capacitor 680 which is coupled to the drain region 651 of the transistor 650. The lower conductive layer 673 corresponds to a second end of the capacitor 680 which is coupled to a bit line BL. The insulating layer 674 corresponds to the insulating material of the capacitor 680 which is configured to break down under a predetermined breakdown voltage. As a result the capacitor 680 and the transistor 650 are serially coupled between a bit line BL and a source line SL (or the ground) to define a memory cell. The capacitor 680 and the transistor 650 at least partially overlap each other in the Z direction, as schematically illustrated in FIG. 6A.

In at least one embodiment, the structure comprising the transistor 650 coupled to the capacitor 680 corresponds to the memory cell Bit_2 described with respect to FIGS. 3, 4A-4D. For example, the capacitor 680 corresponds to the capacitor C2, the transistor 650 corresponds to the transistor T2, the MD region 657 corresponds to the region MD5, the VD via 659 corresponds to the via VD5, the gate electrode 655 corresponds to the gate region P05, the MD region 656 corresponds to the region MD4, the VD via 658 corresponds to the via VD2, the M0 pattern 661 corresponds to the pattern M0_2, the M5 pattern 662 corresponds to the pattern M5_3, the M6 pattern 664 corresponds to the pattern M6_2, the V6 via 665 corresponds to the via V6_2, the M7 pattern 668 corresponds to the pattern M7_2, the V6 via 666 corresponds to the via V6_4, the MIM structure 670 corresponds to the structure MIM_0, the V6 via 667 corresponds to one or more of the vias V6_9, V6_10, V6_11, and the M7 pattern 669 corresponds to the bit line pattern BL0.

In the example configuration in FIG. 6A, the MIM structure 670 is arranged between the M6 layer and the M7 layer. However, other arrangements in which the MIM structure 670 is arranged between any two metal layers of the interconnect structure 660 are within the scopes of various embodiments. In some embodiments, the pattern 668 coupled to the transistor 650 and the pattern 669 coupled to a bit line are arranged in different metal layers. In at least one embodiment, one or more advantages described herein are achievable in the IC device 600A.

Figure 6B:
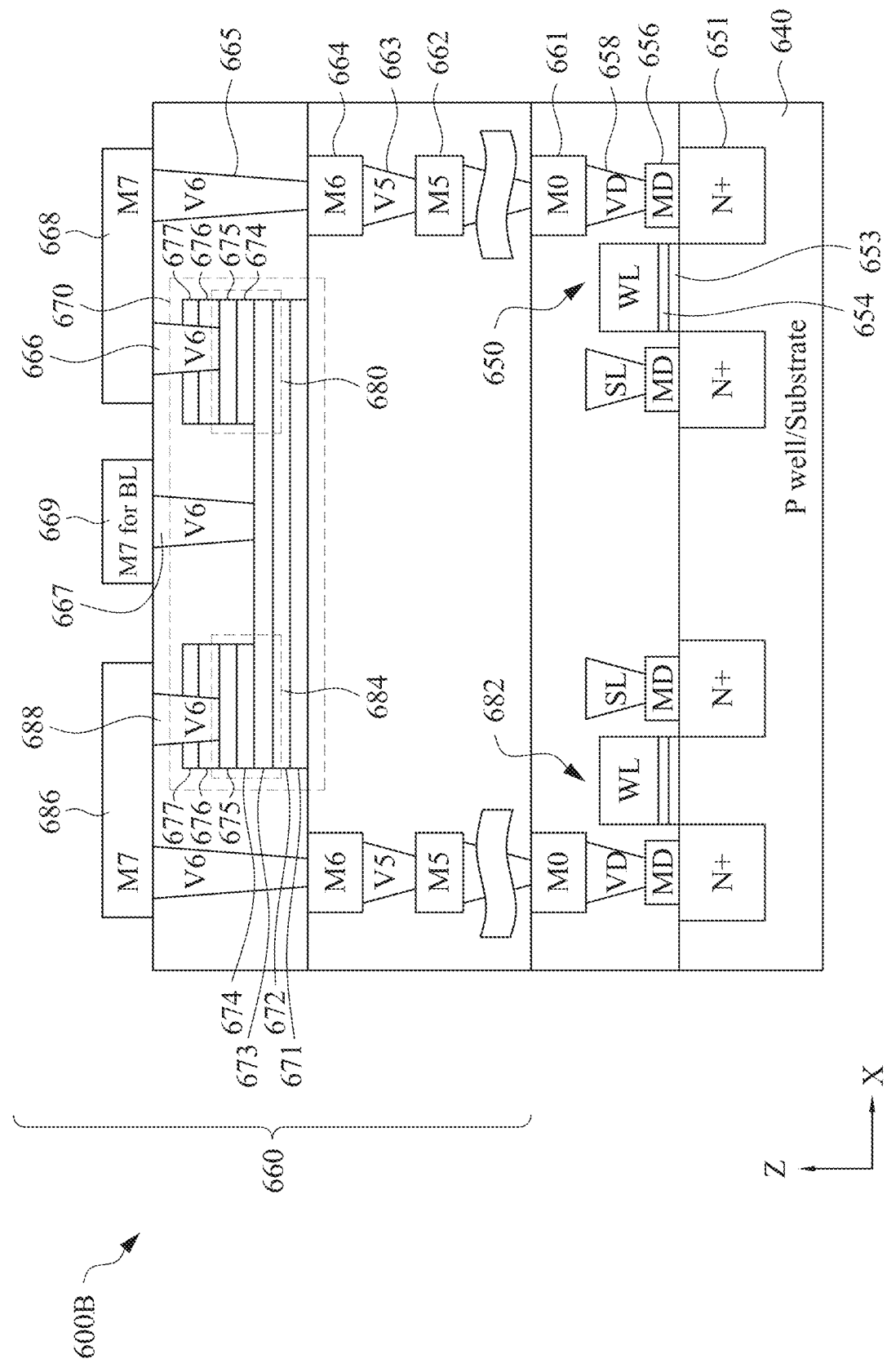

FIG. 6B is a schematic cross-sectional view of an IC device 600B, in accordance with some embodiments. In at least one embodiment, the IC device 600B corresponds to one or more of the memory devices and/or IC layout diagrams described with respect to FIGS. 1, 3, 4A-4D, 5A-5B.

Compared to the IC device 600A, the IC device 600B further comprises a transistor 682 over the substrate 640 and a capacitor 684 in the MIM structure 670. The transistor 682 and the capacitor 684 are serially coupled between a source line SL and a bit line BL to define a memory cell, in a manner similar to the transistor 650 and the capacitor 680. For example, the drain of the transistor 682 is coupled through various metal layers and via layers to an M7 pattern 686, then to a V6 via 688, then to the upper conductive layer 675 defining an upper electrode of the capacitor 684. The lower conductive layer 673 defines a common lower electrode for both the capacitor 680 and the capacitor 684.

In at least one embodiment, the structure comprising the transistor 682 coupled to the capacitor 684 corresponds to the memory cell Bit_1 described with respect to FIGS. 3, 4A-4D. For example, the capacitor 684 corresponds to the capacitor C1, the transistor 682 corresponds to the transistor T1, the M7 pattern 686 corresponds to the pattern M7_7, and the V6 via 688 corresponds to the via V6_3. In at least one embodiment, one or more advantages described herein are achievable in the IC device 600B.

Figure 6C:
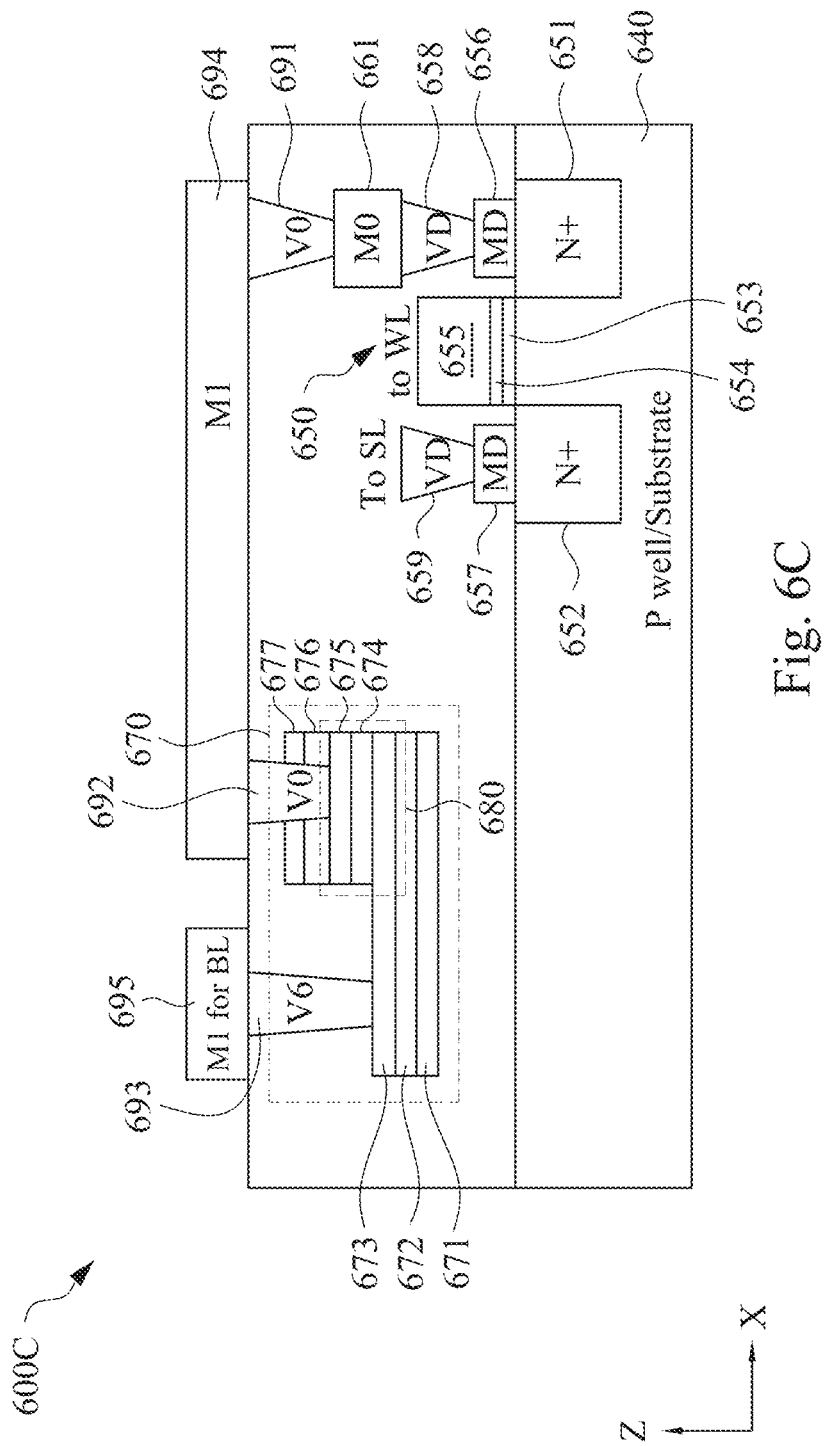

FIG. 6C is a schematic cross-sectional view of an IC device 600C, in accordance with some embodiments. In at least one embodiment, the IC device 600C corresponds to one or more of the memory devices and/or IC layout diagrams described with respect to FIGS. 1, 3, 4A-4D, 5A-5B.

Compared to the IC device 600A in which the pattern 669 for a bit line is arranged in the M7 layer, the IC device 600B comprises a corresponding pattern 695 for a bit line in the M1 layer. The IC device 600C comprises V0 vias 691, 692, 693 and M1 patterns 694, 695 corresponding to the V6 vias 665, 666, 667 and the M7 patterns 668, 669 in the IC device 600A.

In the example configuration in FIG. 6C, one or more layers of the MIM structure 670 are at a same level as, or below, the M0 layer, in the Z direction. In at least one embodiment (not shown), the MIM structure 670 is over the M0 layer in a manner similar to the IC device 600A in which the MIM structure 670 is over the M6 layer.

In the example configuration in FIG. 6C, the capacitor 680 does not overlap the transistor 650 in the Z direction. It is within the scope of various embodiments to form the capacitor 680 to at least partially overlap the transistor 650 in the Z direction even when the capacitor 680 is coupled to a bit line BL in the M1 layer.

The described configurations in which an MIM capacitor in a memory cell is formed immediately under and electrically coupled to the M1 layer or the M7 layer are example. In at least one embodiment, an MIM capacitor in a memory cell is formed immediately under and electrically coupled to any metal layer higher than the M0 layer. In at least one embodiment, one or more advantages described herein are achievable in the IC device 600C.

FIGS. 7A-7D are schematic cross-sectional views of an IC device 700 being manufactured at various stages of a manufacturing process, in accordance with some embodiments. In at least one embodiment, the IC device 700 corresponds to one or more of the memory devices and/or IC layout diagrams and/or IC devices described with respect to FIGS. 1, 3, 4A-4D, 5A-5B, 6A-6C. Components in FIGS. 7A-7D having corresponding components in FIGS. 6A-6C are designated by the reference numerals of FIGS. 6A-6C increased by 100.

Figure 7A:
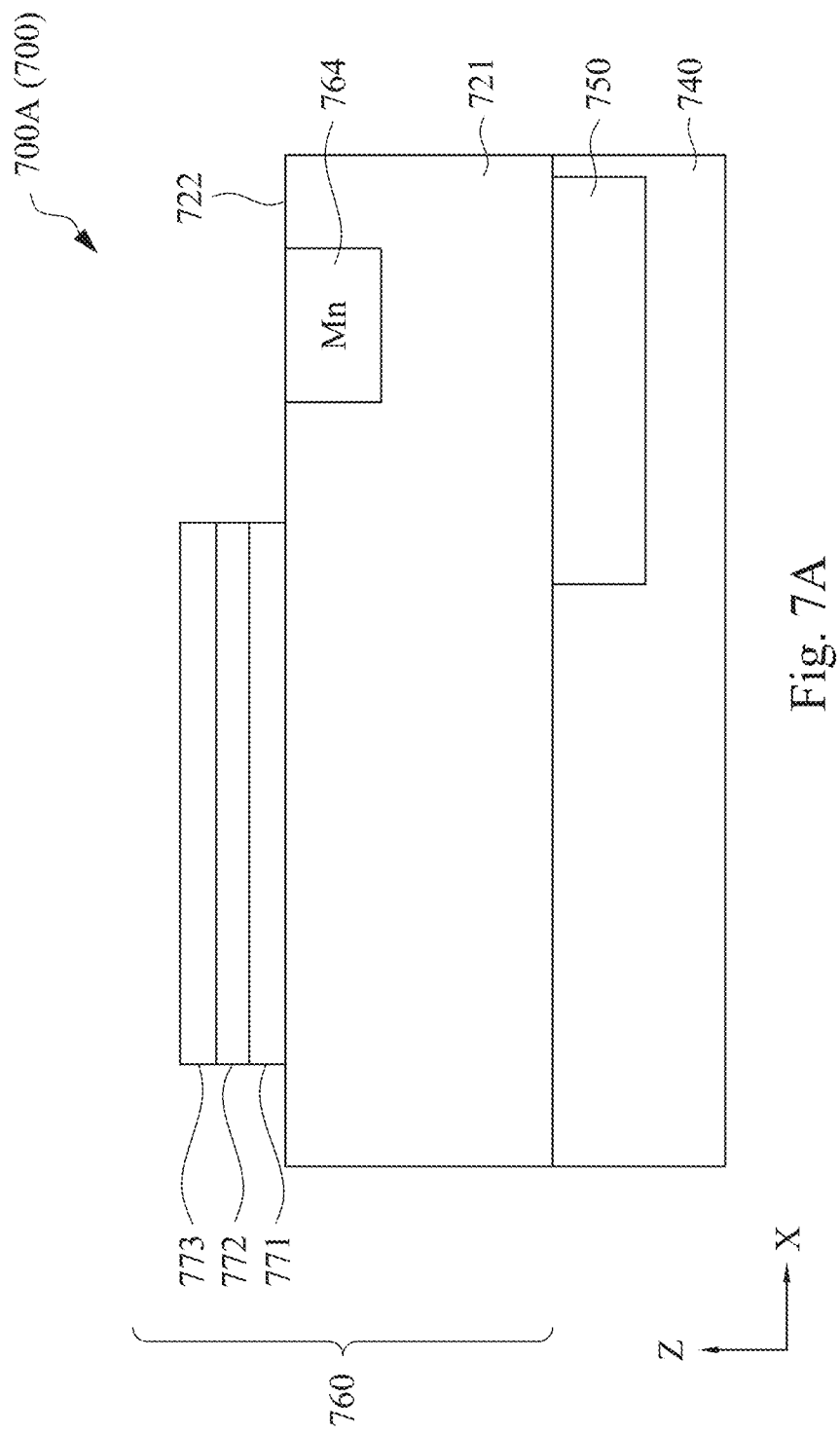
FIGS. 7A-7D are schematic cross-sectional views of an IC device being manufactured at various stages of a manufacturing process, in accordance with some embodiments.

In FIG. 7A, the manufacturing process starts from a substrate 740. The substrate 740 comprises, in at least one embodiment, a silicon substrate. The substrate 740 comprises, in at least one embodiment, silicon germanium (SiGe), Gallium arsenic, or other suitable semiconductor materials.

At least one transistor 750 is formed over the substrate 740 in a front-end-of-line (FEOL) processing. For example, active regions (not shown) are formed in or over the substrate 740, using one or more masks corresponding to one or more active regions in the layout diagram 400. A gate dielectric layer (not shown) is deposited over the substrate 740. In at least one embodiment, the gate dielectric layer corresponds to the gate dielectric layers 653, 654 described with respect to FIG. 6A. Example materials of the gate dielectric layer include, but are not limited to, a high-k dielectric layer, an interfacial layer, and/or combinations thereof. In some embodiments, the gate dielectric layer is deposited over the substrate 740 by atomic layer deposition (ALD) or other suitable techniques. A gate electrode layer (not shown) is deposited over the gate dielectric layer. In at least one embodiment, the gate electrode layer corresponds to the gate electrode 655 described with respect to FIG. 6A. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes.

After the FEOL processing, a back-end-of-line (BEOL) processing is performed to form an interconnect structure 760 over the at least one transistor 750 to electrically couple various elements or circuits of the IC device 700 with each other, and with external circuitry. In at least one embodiment, the interconnect structure 760 comprises both contact structures and sequentially overlying metal and via layers. The contact structures comprise MD regions, VD vias, VG vias. The overlying metal layers and via layers correspondingly comprise metal layers M0, M1, or the like, and via layers V0, V1, or the like. In at least one embodiment, the interconnect structure 760 is manufactured sequentially layer by layer upward from the substrate 740, using one or more masks corresponding to the contact structures, metal layers and via layers in the layout diagram 400.

FIG. 7A shows the interconnect structure 760 at a stage where a metal layer Mn (n is a non-negative integer) has been formed, an ILD layer 721 has been deposited over the metal layer Mn, and a planarizing process has been performed to expose an Mn pattern 764 of the metal layer Mn and to planarize an upper surface 722 of the ILD layer 721. The Mn pattern 764 is coupled to a source/drain region (not shown) of the at least one transistor 750 through one or more metal layer, via layer and/or contact structure (not shown). At this stage, a MIM structure for forming one or more capacitors is started.

Specifically, the formation of the MIM structure comprises sequentially depositing one or more passivation layers 771, 772 over the upper surface 722 of the ILD layer 721, and then depositing a lower conductive layer 773 over the one or more passivation layers 771, 772. The one or more passivation layers 771, 772 and lower conductive layer 773 are deposited, or patterned, to leave the Mn pattern 764 exposed. A resulting structure 700A is obtained, as shown in FIG. 7A.

Figure 7B:
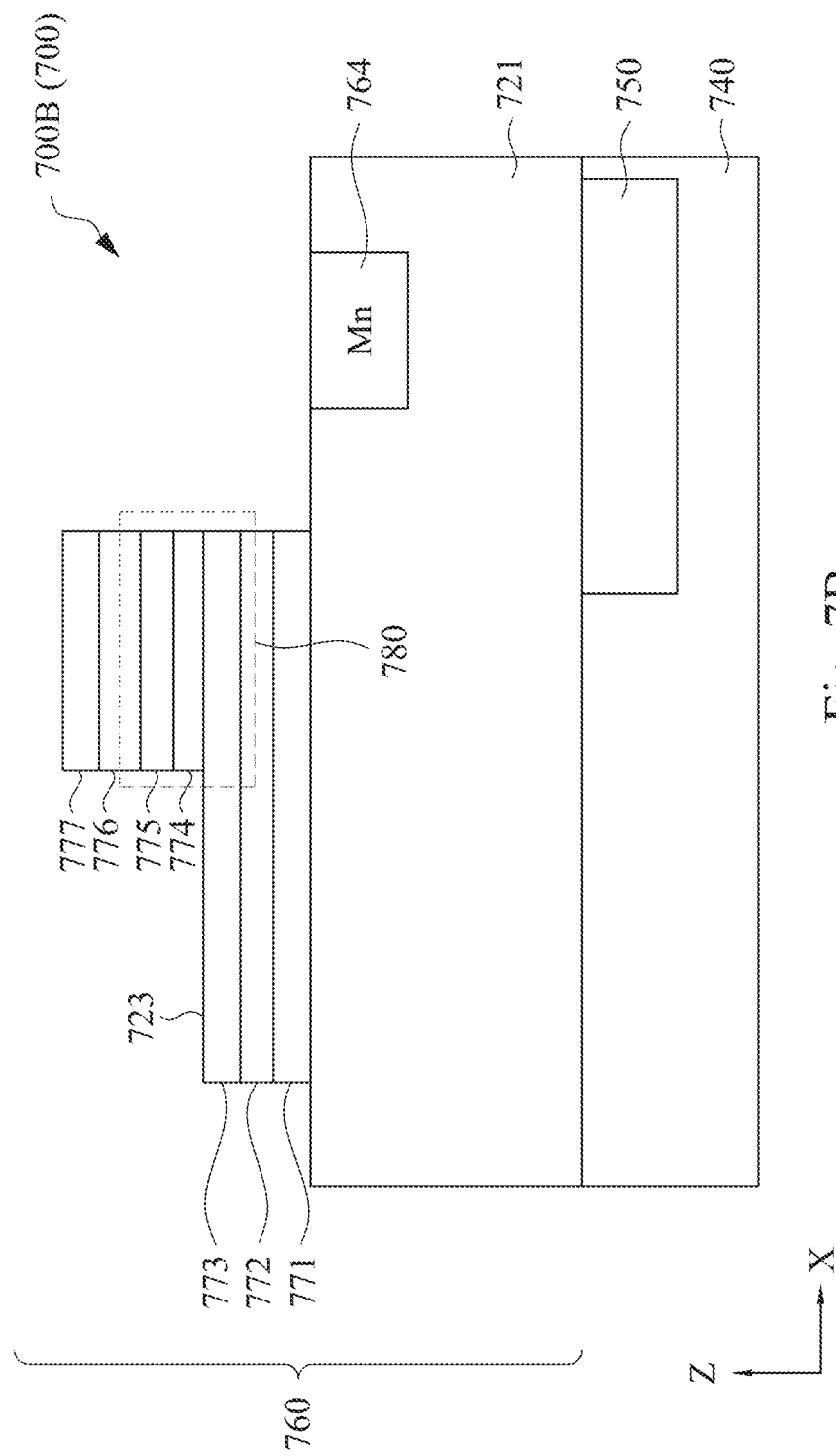

In FIG. 7B, the formation of the MIM structure is continued, by sequentially depositing an insulating layer 774, an upper conductive layer 775, and then one or more passivation layers 776, 777 over the resulting structure shown in FIG. 7A. In at least one embodiment, the insulating layer 774, upper conductive layer 775, and one or more passivation layers 776, 777 are deposited over the whole upper surface of the structure 700A, and then patterned, e.g., by etching, to expose a portion 723 of the lower conductive layer 773. A resulting structure 700B is obtained, as shown in FIG. 7B. The structure 700B comprises a capacitor 780 configured by a multilayer structure in which the insulating layer 774 is sandwiched between the lower conductive layer 773 and the upper conductive layer 775. The capacitor 780 partially overlaps the transistor 750 in the Z direction.

Figure 7C:
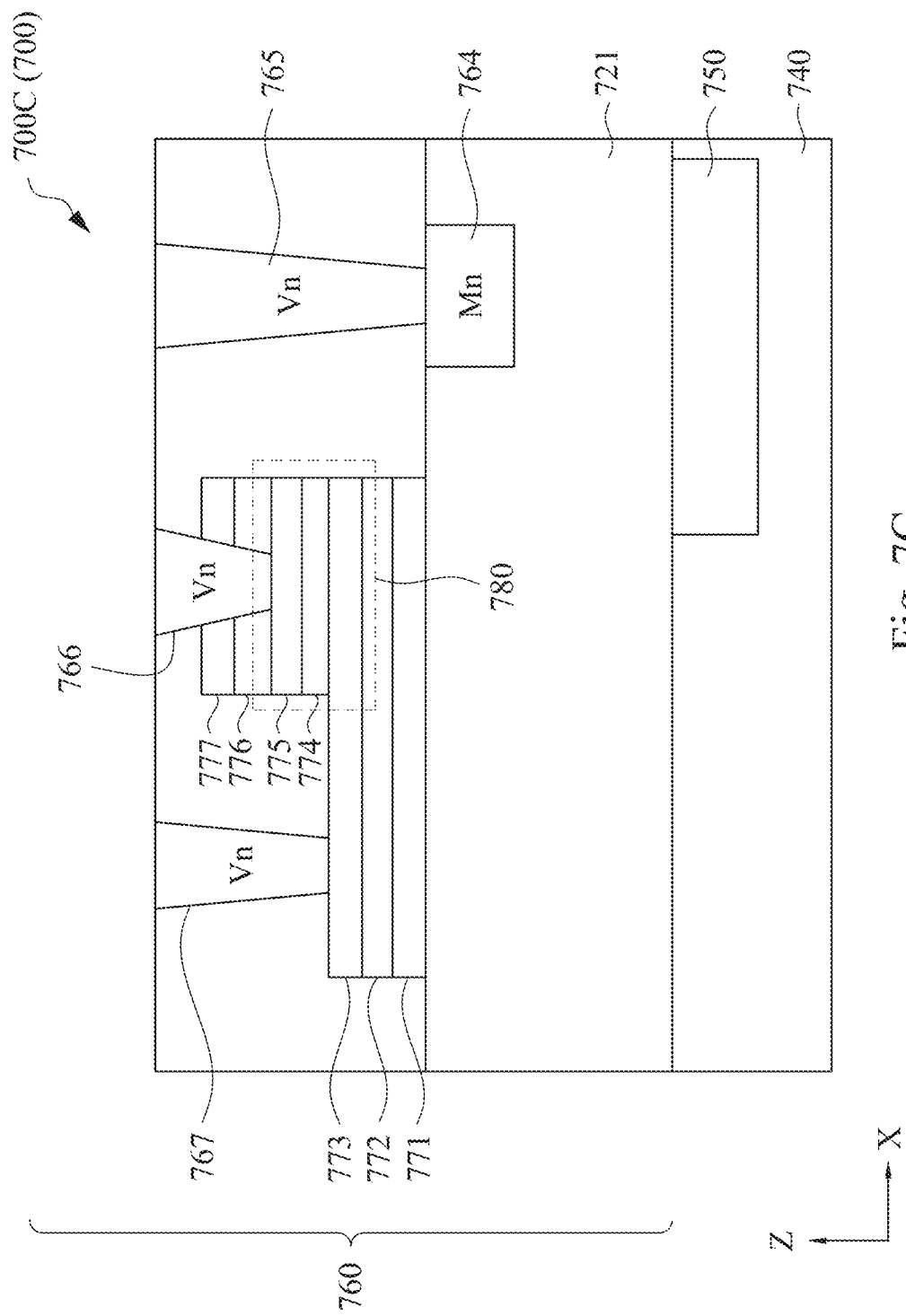

In FIG. 7C, an ILD layer 724 is deposited over the structure 700B, and then vias 765, 766, 767 of a via layer Vn are formed in the ILD layer 724 to correspondingly make electrical contact with the Mn pattern 764, the upper conductive layer 775 and the portion 723 of the lower conductive layer 773. The Vn via 776 extends through not only a thickness portion of the ILD 724, but also the one or more passivation layers 776, 777. A planarizing process is performed, and a resulting structure 700C is obtained, as shown in FIG. 7C.

Figure 7D:
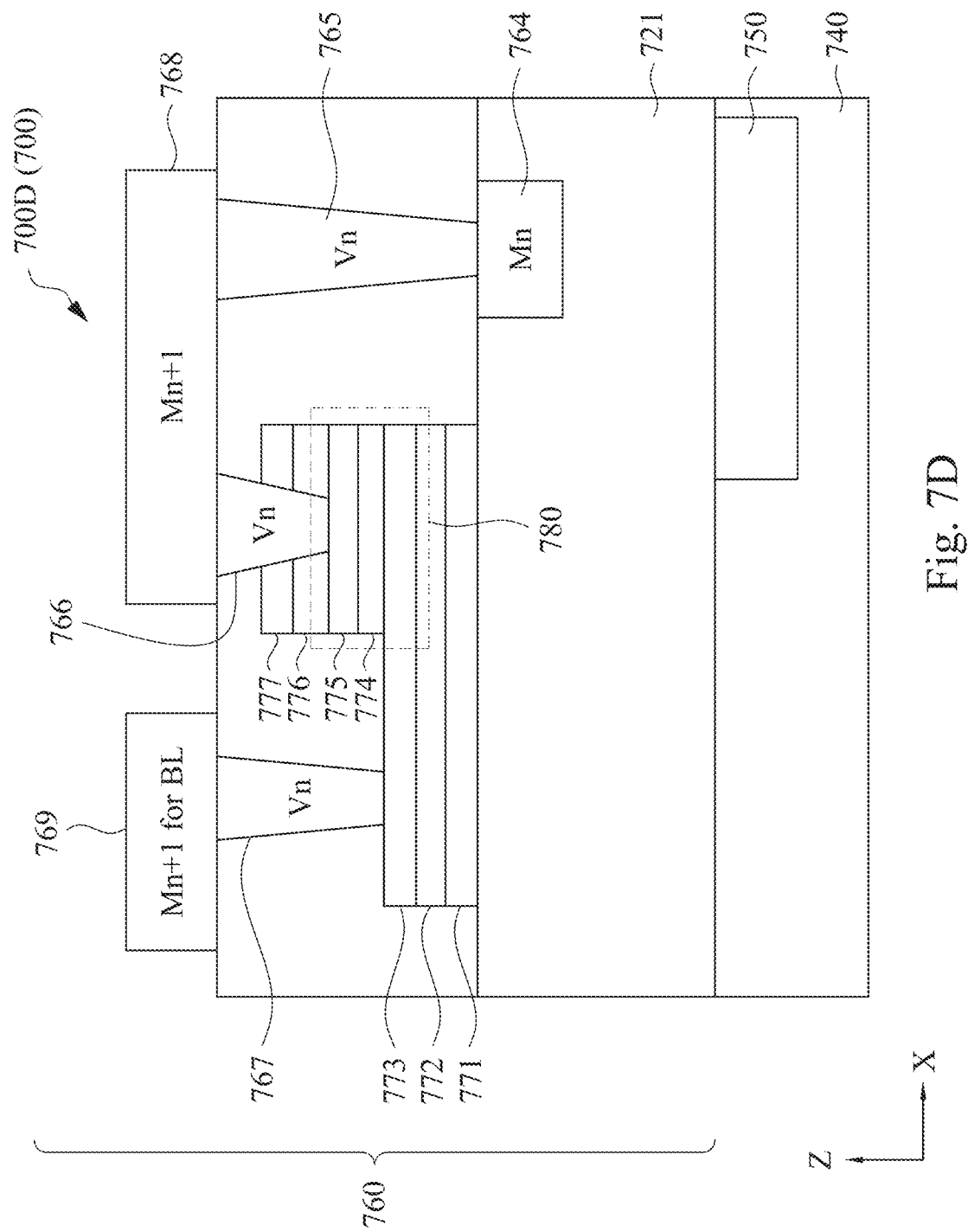

In FIG. 7D, a metal layer Mn+1 is deposited over the structure 700C, and is patterned to obtain Mn+1 patterns 768, 769. The Mn+1 pattern 768 electrically couples the Vn vias 765, 766. The Mn+1 pattern 769 is electrically coupled to the Vn via 767, and is configured as a bit line BL or to be coupled to a bit line BL. A resulting structure 700D is obtained, as shown in FIG. 7D. In some embodiments, one or more further metal layers and/or via layers are formed over the structure 700D to complete the IC device 700. The described manufacturing process is an example. Other manufacturing processes are within the scopes of various embodiments. In at least one embodiment, one or more advantages described herein are achievable in an IC device and/or memory device manufactured in accordance with the described manufacturing process.

Figure 8:
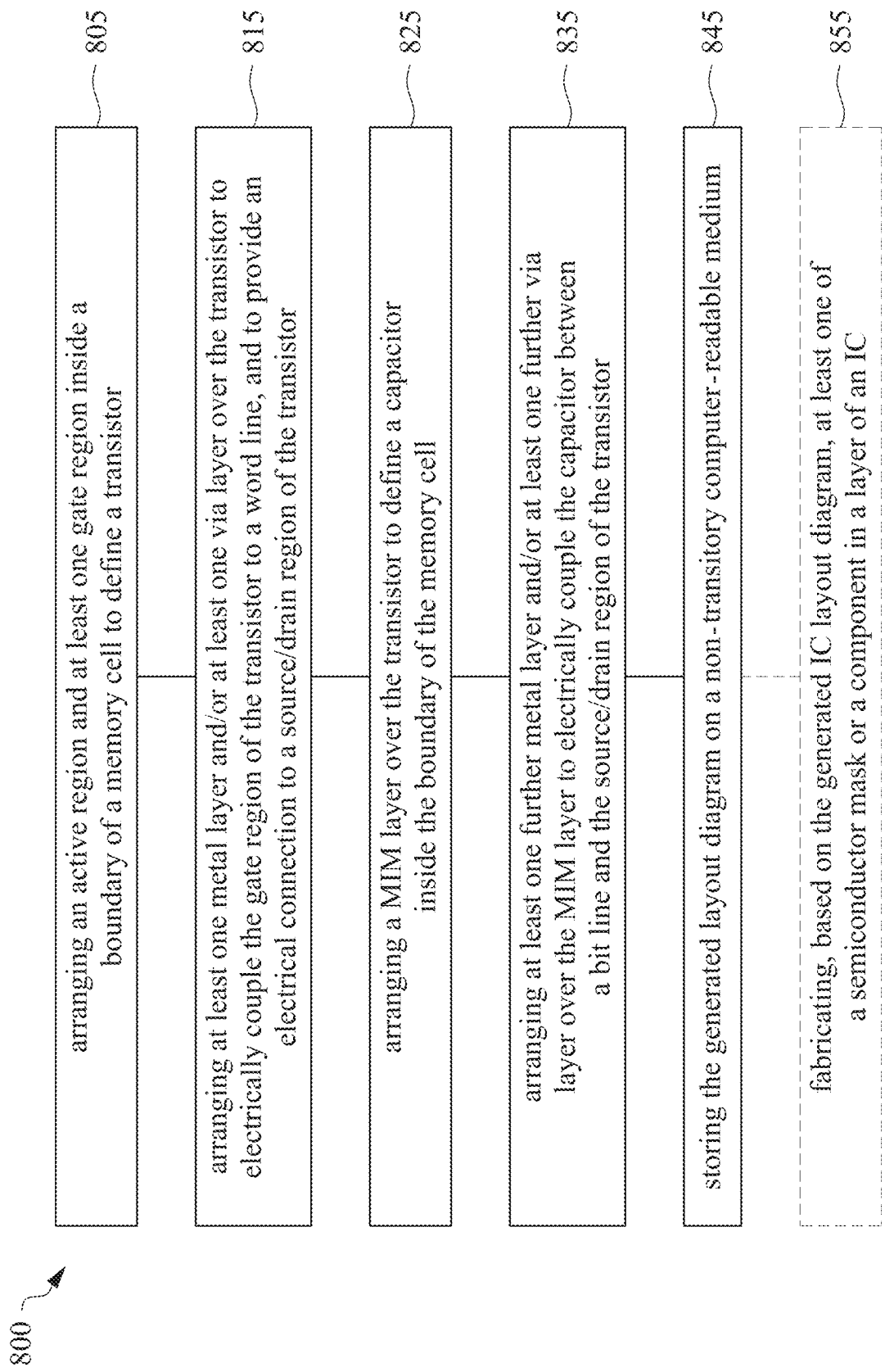
FIG. 8 is a flow chart of a method, in accordance with some embodiments.

FIG. 8 is a flow chart of a method 800, in accordance with some embodiments. In at least one embodiment, the method 800 is for one or more of generating a layout diagram for a memory cell, or building a standard cell library including one or more memory cells.

In some embodiments, one or more operations of the method 800 are performed as part of a method of forming one or more memory devices and/or IC devices described herein. In some embodiments, one or more operations of the method 800 are performed as part of an automated placement and routing (APR) method. In some embodiments, one or more operations of the method 800 are performed by an APR system, e.g., a system included in an EDA system described with respect to FIG. 11. In some embodiments, one or more operations of the method 800 are performed as part of a method 900 described with respect to FIG. 9, for generating a layout diagram of an IC device. In some embodiments, one or more operations of the method 800 are performed as part of a design procedure performed in a design house described with respect to FIG. 12. In some embodiments, one or more operations of the method 800 are executed by a processor, such as a processor of an EDA system described with respect to FIG. 11. In some embodiments, one or more operations of the method 800 are executed by a processor, such as a processor of an EDA system described with respect to FIG. 11. In some embodiments, one or more operations in the method 800 described herein are omitted.

At operation 805, an active region and at least one gate region are arranged inside a boundary of a memory cell to define a transistor. For example, as described herein with respect to FIG. 4A, an active region OD1 and at least one gate region PO5 are arranged inside a boundary of a memory cell Bit_2 to define a transistor T2.

At operation 815, at least one metal layer and/or at least one via layer is arranged over the transistor to electrically couple the gate region of the transistor to a word line, and to provide an electrical connection to a source/drain region of the transistor. For example, as described herein with respect to FIGS. 4B-4D, various metal layers M0, M1, . . . and/or via layers V0, V1, . . . are arranged over the transistor T2 to electrically couple the gate region PO5 of the transistor to a word line WL2, and to provide an electrical connection to a source/drain region (under the region MD4) of the transistor.

At operation 825, a MIM layer is arranged over the transistor to define a capacitor inside the boundary of the memory cell. For example, as described herein with respect to FIG. 4D, a MIM layer comprising a multilayer structure MIM_0 is arranged over the transistor T2. The multilayer structure MIM_0 has a portion defining a capacitor C2 inside the boundary of the memory cell Bit_2.

At operation 835, at least one further metal layer and/or at least one further via layer is arranged over the MIM layer to electrically couple the capacitor between a bit line and the source/drain region of the transistor. For example, as described herein with respect to FIG. 4D, a M7 layer and a V6 layer are arranged over the MIM layer to electrically couple the capacitor C2 between a bit line BL0 and the source/drain region of the transistor T2.

At operation 845, the generated layout diagram of the memory cell having the transistor and the capacitor within the boundary of the memory cell is stored in a standard cell library on a non-transitory computer-readable medium. In some embodiments, various memory cells having symmetrical configurations are generated and stored in the standard cell library. For example, as described herein, layout diagrams of one or more of memory cells Bit_0, Bit_1, Bit_3 are generated and stored in the standard cell library. The memory cell Bit_1 has a layout diagram symmetrical to the layout diagram of the memory cell Bit_2 across the Y direction. The memory cell Bit_0 has a layout diagram symmetrical to the layout diagram of the memory cell Bit_1 across the X direction. The memory cell Bit_3 has a layout diagram symmetrical to the layout diagram of the memory cell Bit_2 across the X direction.

Figure 12:
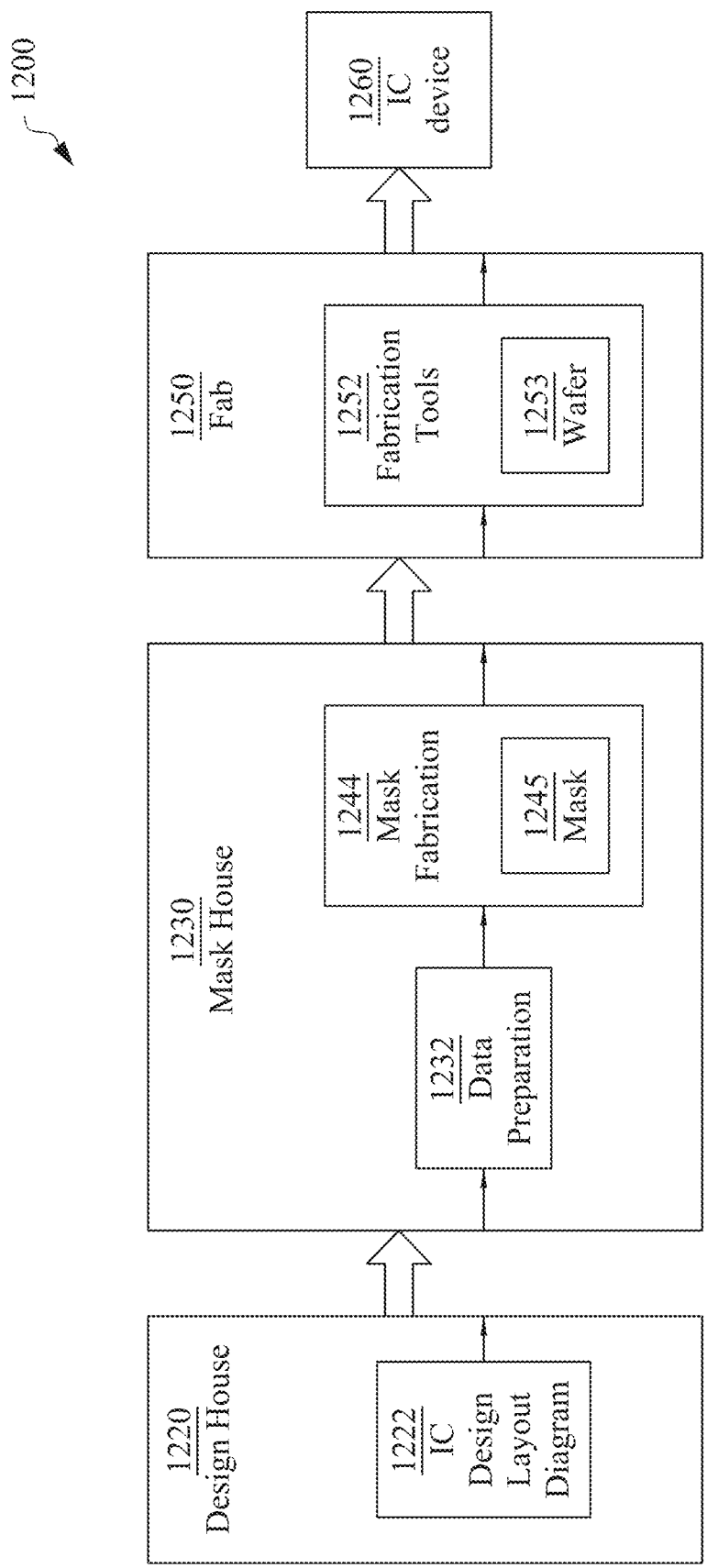
FIG. 12 is a block diagram of an IC manufacturing system and an IC manufacturing flow associated therewith, in accordance with some embodiments.

At operation 855, based on the generated layout diagram, at least one of a semiconductor mask or a component in a layer of an IC device is fabricated, for example, as described with respect to FIG. 12. In at least one embodiment, operation 855 is omitted.

In at least one embodiment, all operations of the method 800 are automatically performed without user input or intervention.

Figure 9:
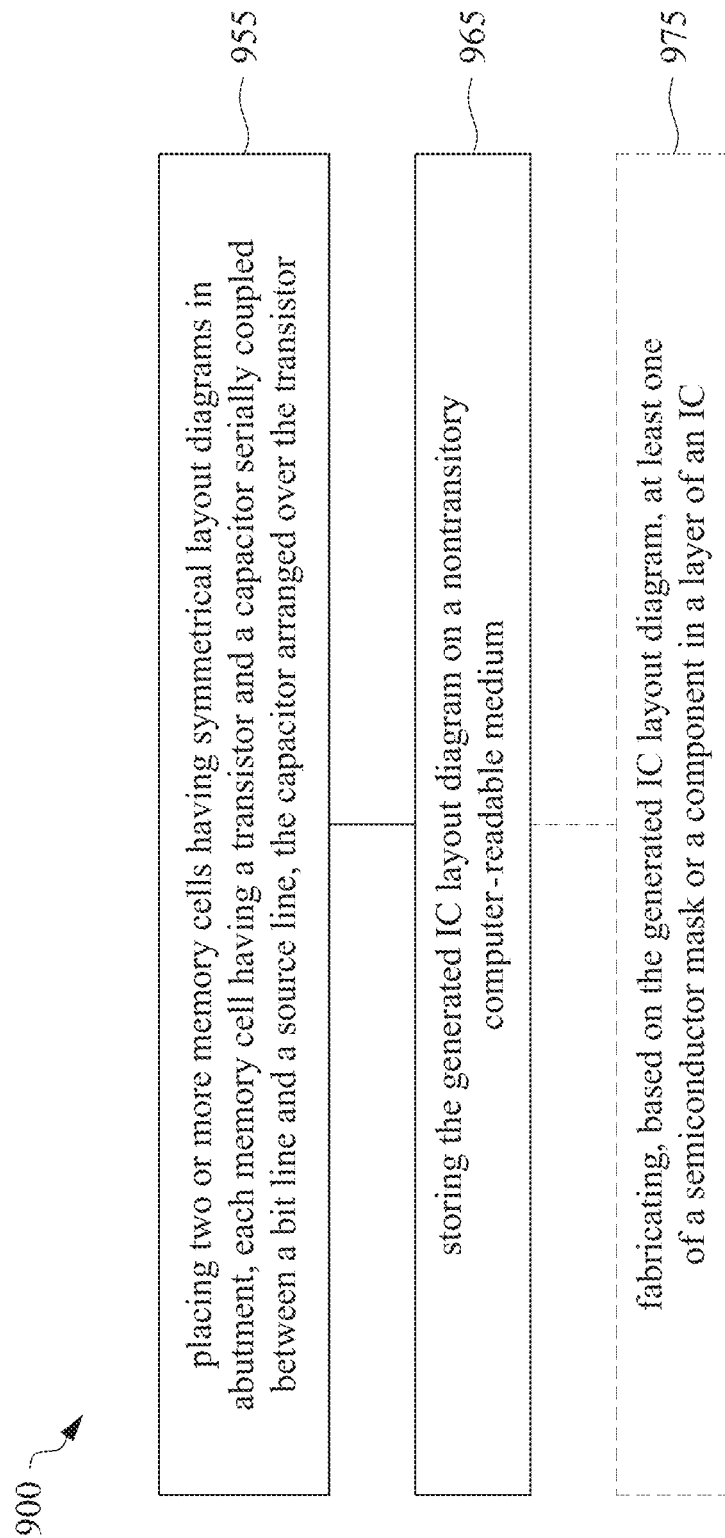
FIG. 9 is a flow chart of a method, in accordance with some embodiments.

FIG. 9 is a flow chart of a method 900, in accordance with some embodiments. In at least one embodiment, the method 900 is for generating an IC layout diagram of an IC device, based on cells received from a standard cell library.

In some embodiments, one or more operations of the method 900 are performed as part of forming one or more memory devices and/or IC devices described herein. In some embodiments, one or more operations of the method 900 are performed as part of an APR method. In some embodiments, one or more operations of the method 900 are performed by an APR system, e.g., a system included in an EDA system described with respect to FIG. 11, and configured to perform the APR method. In some embodiments, one or more operations of the method 900 are performed as part of a design procedure performed in a design house described with respect to FIG. 12. In some embodiments, one or more operations of the method 900 are executed by a processor, such as a processor of an EDA system described with respect to FIG. 11.

At operation 955, two or more memory cells having symmetrical layout diagrams are placed in abutment, each memory cell having a transistor and a capacitor serially coupled between a bit line and a source line, the capacitor arranged over the transistor. For example, one or more of memory cells Bit_0, Bit_1, Bit_2, Bit_3 are read from a standard cell library. The memory cells Bit_0, Bit_1, Bit_2, Bit_3 have mutually symmetrical layout diagrams as described herein. Each of memory cells Bit_0, Bit_1, Bit_2, Bit_3 has a transistor T0, T1, T2, T3 and a capacitor C0, C1, C2, C3 serially coupled between a bit line BL and a source line SL as described with respect to FIGS. 2A-2C, 3. The capacitor C0, C1, C2, C3 is arranged over the transistor T0, T1, T2, T3 as described with respect to FIG. 4D. The memory cells Bit_0, Bit_1, Bit_2, Bit_3 having mutually symmetrical layout diagrams are placed in abutment to obtain an IC layout diagram 400, as described with respect to FIG. 4D. In some embodiments, multiple instances of the IC layout diagram 400 are repeatedly placed in abutment with each other in at least one of the X direction or the Y direction to obtain a larger IC layout diagram for a memory device. An example where two instances of the IC layout diagram 400 are placed in abutment with each other in the Y direction is described with respect to FIG. 5A.

At operation 965, the generated IC layout diagram is stored on a non-transitory computer-readable medium. For example, the IC layout diagram 400, 500 is stored on a non-transitory computer-readable medium.

At operation 975, based on the generated IC layout diagram, at least one of a semiconductor mask or a component in a layer of an IC is fabricated, for example, as described with respect to FIG. 12. In at least one embodiment, operation 975 is omitted. In at least one embodiment, all operations of the method 900 are automatically performed without user input or intervention.

In some embodiments, one or more cells, IC devices, and methods described are applicable to various types of transistor or device technologies including, but not limited to, planar transistor technology, FINFET technology, nanosheet FET technology, nanowire FET technology, or the like.

Figure 10:
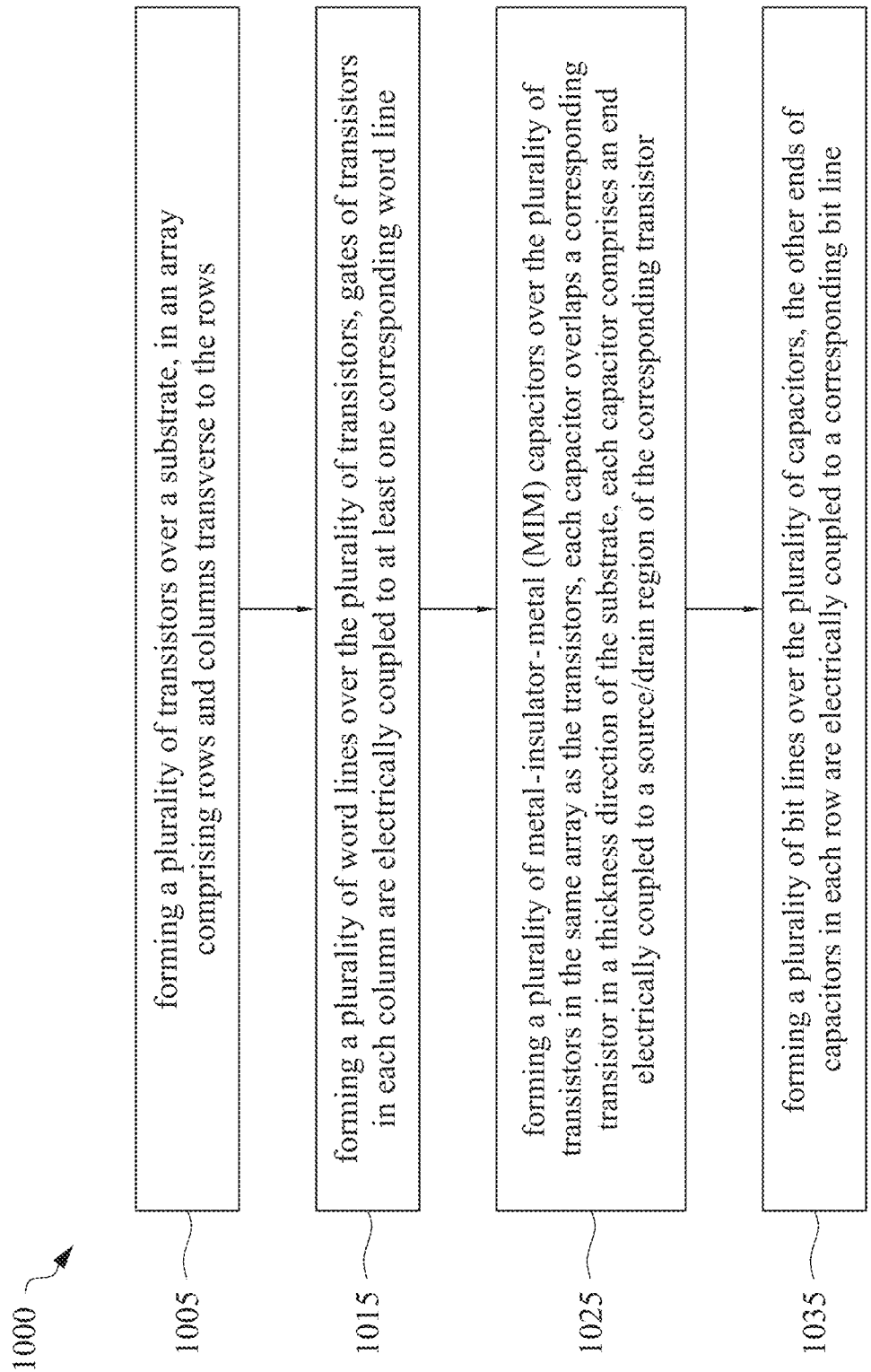
FIG. 10 is a flow chart of a method, in accordance with some embodiments.

FIG. 10 is a flow chart of a method 1000 of manufacturing an IC device, in accordance with some embodiments. In at least one embodiment, an IC device is manufactured in accordance with the manufacturing method 1000 based on an IC layout diagram generated by the method 900.

At operation 1005, a plurality of transistors is formed over a substrate. The plurality of transistors is arranged in an array comprising rows and columns transverse to the rows. For example, a plurality of transistors is formed over a substrate 640, 740, as described with respect to FIGS. 6A-6C, 7A. The plurality of transistors, e.g., transistors T0, T1, . . . T7, is arranged in an array comprising rows and columns transverse to the rows, as described with respect to FIG. 5B.

At operation 1015, a plurality of word lines is formed over the plurality of transistors. The gates of transistors in each of the columns are electrically coupled to at least one corresponding word line among the plurality of word lines. For example, a plurality of word lines WL0, WL1, WL2, WL3 is formed over the transistors, as described with respect to FIGS. 4B, 6A-6C, 7A. Gates of the transistors in each column, e.g., transistors T0, T4 in column 547, are electrically coupled to at least one corresponding word line, e.g., word line WL0, as described with respect to FIG. 5B. Gates of the further transistors in the same column, e.g., transistors T1, T5 in column 547, are electrically coupled to a further corresponding word line, e.g., word line WL1.

At operation 1025, a plurality of MIM capacitors is formed over the plurality of transistors. The plurality of capacitors is arranged in the same array as the plurality of transistors. Each capacitor among the plurality of capacitors overlaps a corresponding transistor among the plurality of transistors in a thickness direction of the substrate. Each capacitor among the plurality of capacitors comprises a first end, and a second end electrically coupled to a source/drain region of the corresponding transistor. For example, a plurality of capacitors is formed over the transistors, as described with respect to FIGS. 6A-6C, 7B. The capacitors, e.g., capacitor C0, C1, . . . C7, is arranged in the same array as the transistors T0, T1, . . . T7, as described with respect to FIG. 5B. Each capacitor, e.g., capacitor 680, overlaps a corresponding transistor, e.g., transistor 650, in the Z direction, as described with respect to FIGS. 4D, 6A-6B, 7B. Each capacitor, e.g., capacitor 680, comprises an end, e.g., upper conductive layer 675, electrically coupled to a source/drain region, e.g., drain region 651, of the corresponding transistor, e.g., transistor 650, as described with respect to FIGS. 2A-2B, 3, 5B, 6A-6C.

At operation 1035, a plurality of bit lines is formed over the plurality of capacitors. The first ends of capacitors in each of the rows is electrically coupled to a corresponding bit line among the plurality of bit lines. For example, a plurality of bit lines BL0, BL1 is formed over the capacitors C0, C1, . . . C7, as described with respect to FIG. 5A, 6A-6C, 7D. The other ends of the capacitors in each row, e.g., capacitor C1, C2 in row 541, are electrically coupled to a corresponding bit line, e.g., bit line BL0, as described with respect to FIGS. 5B, 6A-6C, 7D.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EAD system is usable as part of a design house of an IC manufacturing system discussed below.

Figure 11:
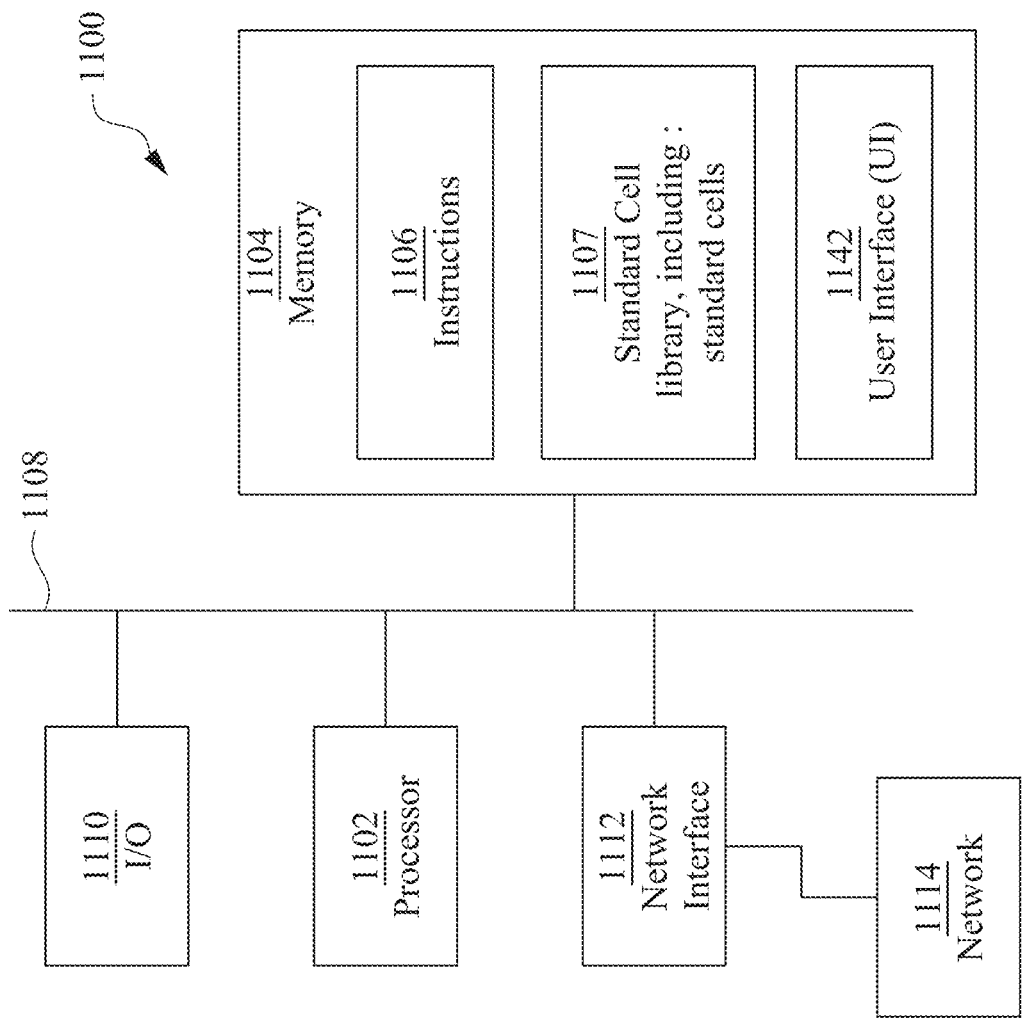
FIG. 11 is a block diagram of an EDA system, in accordance with some embodiments.

FIG. 11 is a block diagram of an electronic design automation (EDA) system 1100 in accordance with some embodiments.

In some embodiments, EDA system 1100 includes an APR system. Methods described herein of designing layout diagrams represent wire routing arrangements, in accordance with one or more embodiments, are implementable, for example, using EDA system 1100, in accordance with some embodiments.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of the methods described herein in accordance with one or more embodiments (hereinafter, the noted processes and/or methods).

Processor 1102 is electrically coupled to computer-readable storage medium 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores library 1107 of standard cells including such standard cells as disclosed herein.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

System 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as user interface (UI) 1142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

FIG. 12 is a block diagram of an integrated circuit (IC) manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place-and-route operation. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 includes fabrication tools 1252 configured to execute various manufacturing operations on semiconductor wafer 1253 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

Details regarding an integrated circuit (IC) manufacturing system (e.g., system 1200 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a memory device comprises at least one bit line, at least one word line, at least one memory cell comprising a capacitor and a transistor, and a controller coupled to the at least one memory cell via the at least one bit line and the at least one word line. The transistor has a gate terminal coupled to the word line, a first terminal, and a second terminal. The capacitor has a first end coupled to the first terminal of the transistor, a second end coupled to the bit line, and an insulating material between the first end and the second end. The insulating material is configured to break down under a predetermined break-down voltage or higher applied between the first end and the second end. The controller is configured to, in a programming operation, apply a turn-ON voltage via the at least one word line to the gate terminal of the transistor to turn ON the transistor, and apply a program voltage via the at least one bit line to the second end of the capacitor to apply, while the transistor is turned ON, the predetermined break-down voltage or higher between the first end and the second end of the capacitor to break down the insulating material of the capacitor.

In some embodiments, an integrated circuit (IC) device comprises a substrate having thereon a plurality of transistors, a metal layer over the substrate, and a plurality of metal-insulator-metal (MIM) structures between the metal layer and the substrate in a thickness direction of the substrate. The metal layer comprises at least one bit line, and a plurality of conductive patterns electrically isolated from the at least one bit line. Each MIM structure among the plurality of MIM structures comprises a first conductive pattern in a first conductive layer over the substrate, a second conductive pattern in a second conductive layer over the substrate, and an insulating material in an insulating layer between the first conductive layer and the second conductive layer. The first conductive pattern is electrically coupled to the at least one bit line. The second conductive pattern is electrically coupled to a corresponding conductive pattern among the plurality of conductive patterns. The corresponding conductive pattern is electrically coupled to a first source/drain region of a corresponding transistor among the plurality of transistors.

In some embodiments, a method comprises forming a plurality of transistors over a substrate, forming a plurality of metal-insulator-metal (MIM) structures over the plurality of transistors, forming a plurality of first-third vias, forming a plurality of conductive patterns over the plurality of MIM structures, and forming a plurality of bit lines over the plurality of MIM structures. Each MIM structure among the plurality of MIM structures comprises a first conductive pattern in a first conductive layer over the substrate, a second conductive pattern in a second conductive layer over the substrate, and an insulating material in an insulating layer between the first conductive layer and the second conductive layer. For each MIM structure among the plurality of MIM structures, the first conductive pattern is under and in electrical contact with a lower end of a corresponding first via among the plurality of first vias, the second conductive pattern is under and in electrical contact with a lower end of a corresponding second via among the plurality of second vias, and a source/drain region of a corresponding transistor among the plurality of transistors is electrically coupled to a lower end of a corresponding third via among the plurality of third vias. Each conductive pattern among the plurality of conductive patterns is over and electrically couples an upper end of a second via among the plurality of second vias and an upper end of a third via among the plurality of third vias, to electrically couple the second conductive pattern of each MIM structure among the plurality of MIM structures to the source/drain region of the corresponding transistor. Each bit line among the plurality of bit lines is over and in electrical contact with upper ends of the first vias electrically coupled to the first conductive patterns of multiple MIM structures among the plurality of MIM structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   at least one bit line;
   at least one word line;
   at least one memory cell comprising a capacitor and a transistor; and
   a controller coupled to the at least one memory cell via the at least one bit line and the at least one word line,
   wherein
   the transistor has
     a gate terminal coupled to the word line,
     a first terminal, and
     a second terminal,
   the capacitor has
     a first end coupled to the first terminal of the transistor,
     a second end coupled to the bit line, and
     an insulating material between the first end and the second end, and configured to break down under a predetermined break-down voltage or higher applied between the first end and the second end,
   the controller is configured to, in a programming operation, apply a turn-ON voltage via the at least one word line to the gate terminal of the transistor to turn ON the transistor, and apply a program voltage via the at least one bit line to the second end of the capacitor to apply, while the transistor is turned ON, the predetermined breakdown voltage or higher between the first end and the second end of the capacitor to break down the insulating material of the capacitor to write into the at least one memory cell a first logic value corresponding to the insulating material that has been broken down.

2. The memory device of claim 1, wherein
the memory device further comprises at least one further memory cell storing a second logic value different from the first logic value, the second logic value corresponding to an insulating material of the at least one further memory cell not yet broken down.

3. The memory device of claim 1, wherein
the second terminal of the transistor is grounded.

4. The memory device of claim 1, wherein
the controller is configured to, in a read operation,
apply the turn-ON voltage via the at least one word line to the gate terminal of the transistor to turn ON the transistor, and
apply a read voltage via the at least one bit line to the second end of the capacitor to detect, while the transistor is turned ON, a datum stored in the at least one memory cell.

5. The memory device of claim 1, wherein
the at least one word line is a plurality of word lines,
the at least one memory cell is a plurality of memory cells,
the second ends of the capacitors of the plurality of memory cells are commonly coupled to the at least one bit line,
the gate terminals of the transistors of the plurality of memory cells are correspondingly coupled to the plurality of word lines, and
the second terminals of the transistors of the plurality of memory cells are grounded.

6. The memory device of claim 1, wherein
the at least one bit line is a plurality of bit lines,
the at least one word line is a plurality of word lines,
the at least one memory cell is a plurality of strings of memory cells,
the second ends of the capacitors of the memory cells in each string among the plurality of strings of memory cells are commonly coupled to a corresponding bit line among the plurality of bit lines,
the gate terminals of the transistors of the memory cells in each string among the plurality of strings of memory cells are correspondingly coupled to the plurality of word lines, and
the second terminals of the transistors of the memory cells in the plurality of strings of memory cells are grounded.

7. The memory device of claim 1, further comprising:
a substrate having thereon the transistor; and
at least one metal layer over the substrate, the at least one metal layer comprising the at least one bit line, and a conductive pattern electrically isolated from the at least one bit line.

8. The memory device of claim 7, wherein
the first end of the capacitor is electrically coupled to a first portion of the conductive pattern,
the second end of the capacitor is electrically coupled to the at least one bit line, and a second portion of the conductive pattern is electrically coupled to the first terminal of the transistor.

9. The memory device of claim 8, wherein
the at least one metal layer is higher than a metal-zero layer over the substrate.

10. The memory device of claim 1, wherein
the capacitor is a metal-insulator-metal (MIM) capacitor.

11. An integrated circuit (IC) device, comprising:
a substrate having thereon a plurality of transistors;
a metal layer over the substrate, the metal layer comprising:
at least one bit line, and
a plurality of conductive patterns electrically isolated from the at least one bit line; and
a plurality of metal-insulator-metal (MIM) structures between the metal layer and the substrate in a thickness direction of the substrate,
wherein
each MIM structure among the plurality of MIM structures comprises:
a first conductive pattern in a first conductive layer over the substrate, the first conductive pattern electrically coupled to the at least one bit line,
a second conductive pattern in a second conductive layer over the substrate, the second conductive pattern electrically coupled to a corresponding conductive pattern among the plurality of conductive patterns, the corresponding conductive pattern electrically coupled to a first source/drain region of a corresponding transistor among the plurality of transistors, and
an insulating material in an insulating layer between the first conductive layer and the second conductive layer.

12. The IC device of claim 11, wherein
the first conductive layer is between the metal layer and the substrate in the thickness direction, and
the second conductive layer is between the metal layer and the substrate in the thickness direction.

13. The IC device of claim 12, further comprising:
a plurality of first vias, a plurality of second vias, and a plurality of third vias,
wherein, for each MIM structure among the plurality of MIM structures,
a first via among the plurality of first vias extends downward in the thickness direction from the at least one bit line to the first conductive pattern of the MIM structure,
a second via among the plurality of second vias extends downward in the thickness direction from a first portion of the corresponding conductive pattern to the second conductive pattern of the MIM structure, and
a third via among the plurality of third vias extends downward in the thickness direction from a second portion of the corresponding conductive pattern to electrically couple the second conductive pattern of the MIM structure to the first source/drain region of the corresponding transistor.

14. The IC device of claim 13, wherein
each MIM structure among the plurality of MIM structures does not overlap the corresponding transistor in the thickness direction of the substrate.

15. The IC device of claim 12, further comprising:
first and second passivation layers between which the first conductive layer, the second conductive layer and the insulating layer are sandwiched in the thickness direction.

16. The IC device of claim 11, wherein
each transistor among the plurality of transistors further comprises a second source/drain region which is grounded.

17. The IC device of claim 11, further comprising:
a plurality of word lines each electrically coupled to a gate region of a corresponding transistor among the plurality of transistors.

18. The IC device of claim 11, further comprising:
an interconnect structure over the substrate and electrically coupled to the plurality of transistors,
wherein
the interconnect structure comprises a plurality of metal layers stacked one over another in the thickness direction,
the plurality of metal layers comprises
the metal layer comprising the at least one bit line, and
a underlying metal layer immediately below the metal layer, and
each of the plurality of MIM structures is entirely between the metal layer and the underlying metal layer in the thickness direction.

19. A method, comprising:
forming a plurality of transistors over a substrate;
forming a plurality of metal-insulator-metal (MIM) structures over the plurality of transistors, wherein
each MIM structure among the plurality of MIM structures comprises:
a first conductive pattern in a first conductive layer over the substrate,
a second conductive pattern in a second conductive layer over the substrate, and
an insulating material in an insulating layer between the first conductive layer and the second conductive layer;
forming a plurality of first vias, a plurality of second vias, and a plurality of third vias, wherein, for each MIM structure among the plurality of MIM structures,
the first conductive pattern is under and in electrical contact with a lower end of a corresponding first via among the plurality of first vias,
the second conductive pattern is under and in electrical contact with a lower end of a corresponding second via among the plurality of second vias, and
a source/drain region of a corresponding transistor among the plurality of transistors is electrically coupled to a lower end of a corresponding third via among the plurality of third vias;
forming a plurality of conductive patterns over the plurality of MIM structures, wherein
each conductive pattern among the plurality of conductive patterns is over and electrically couples an upper end of a second via among the plurality of second vias and an upper end of a third via among the plurality of third vias, to electrically couple the second conductive pattern of each MIM structure among the plurality of MIM structures to the source/drain region of the corresponding transistor; and
forming a plurality of bit lines over the plurality of MIM structures, wherein
each bit line among the plurality of bit lines is over and in electrical contact with upper ends of the first vias electrically coupled to the first conductive patterns of multiple MIM structures among the plurality of MIM structures.

20. The method of claim 19, further comprising:
forming a plurality of word lines over the plurality of transistors, wherein
the plurality of transistors is arranged in an array comprising rows and columns transverse to the rows,
the transistors in each of the columns comprise:
first transistors having gates electrically coupled to a first corresponding word line among the plurality of word lines, and
second transistors having gates electrically coupled to a second corresponding word line among the plurality of word lines, and
each bit line among the plurality of bit lines is electrically coupled to the first conductive patterns of the MIM structures in two of the rows.

* * * * *